(12) United States Patent
Tamarkin et al.

(10) Patent No.: US 7,646,602 B1
(45) Date of Patent: Jan. 12, 2010

(54) APPARATUS AND METHODS FOR COOLING NETWORK SWITCHES

(75) Inventors: Vladimir Tamarkin, Huntingdon Valley, PA (US); Mark W. Wessel, Aston, PA (US)

(73) Assignee: QLOGIC, Corporation, Aliso Viejo, CA (US)

( * ) Notice: Subject to any disclaimer, the term of this patent is extended or adjusted under 35 U.S.C. 154(b) by 0 days.

(21) Appl. No.: 12/201,304

(22) Filed: Aug. 29, 2008

(51) Int. Cl.
*H05K 7/20* (2006.01)
(52) U.S. Cl. ........................................ 361/695; 361/694
(58) Field of Classification Search ........................ None
See application file for complete search history.

(56) References Cited

U.S. PATENT DOCUMENTS

| | | | |
|---|---|---|---|
| 3,967,874 A | 7/1976 | Calabro | |
| 4,261,519 A | 4/1981 | Ester | |
| 4,399,485 A | 8/1983 | Wright et al. | |
| 5,493,474 A | 2/1996 | Schkrohowsky et al. | |
| 5,544,012 A | 8/1996 | Koike | |
| 6,067,223 A | 5/2000 | Diebel et al. | |
| 6,151,210 A | 11/2000 | Cercioglu et al. | |
| 6,186,890 B1 | 2/2001 | French et al. | |
| 6,506,111 B2 | 1/2003 | Sharp et al. | |
| 6,611,428 B1 | 8/2003 | Wong | |
| 6,639,794 B2 | 10/2003 | Olarig et al. | |
| 6,643,123 B2 | 11/2003 | Hartel et al. | |
| 6,652,373 B2 | 11/2003 | Sharp et al. | |
| 6,675,976 B2 * | 1/2004 | Steinman et al. ............... 211/26 |
| 6,745,579 B2 | 6/2004 | Spinazzola et al. | |
| 6,816,590 B2 | 11/2004 | Pike et al. | |
| 6,889,752 B2 | 5/2005 | Stoller | |
| 7,011,576 B2 | 3/2006 | Sharp et al. | |
| 7,016,193 B1 | 3/2006 | Jacques et al. | |
| 7,033,267 B2 | 4/2006 | Rasmussen | |
| 7,112,131 B2 | 9/2006 | Rasmussen et al. | |
| 7,154,748 B2 | 12/2006 | Yamada | |
| 7,173,817 B2 | 2/2007 | Wei | |
| 7,182,208 B2 | 2/2007 | Tachibana | |
| 7,209,351 B2 | 4/2007 | Wei | |
| 7,245,485 B1 | 7/2007 | Morrell | |
| 7,259,961 B2 | 8/2007 | Lucero et al. | |
| 7,283,358 B2 | 10/2007 | Campbell et al. | |
| 7,286,345 B2 * | 10/2007 | Casebolt ................ 361/679.48 |
| 7,295,442 B2 * | 11/2007 | Garnett et al. ............... 361/728 |
| 7,309,279 B2 | 12/2007 | Sharp et al. | |
| 7,372,695 B2 | 5/2008 | Coglitore et al. | |
| 7,414,835 B2 * | 8/2008 | Katakura et al. ........ 361/679.33 |
| 7,426,111 B2 | 9/2008 | Sonobe et al. | |
| 7,438,124 B2 | 10/2008 | Bhatti et al. | |
| 7,458,815 B2 * | 12/2008 | Fallah-Adl et al. ............ 439/61 |
| 7,500,911 B2 | 3/2009 | Johnson et al. | |

(Continued)

OTHER PUBLICATIONS

"Non-Final Office Action dated Oct. 8, 2009 for US U.S. Appl. No. 12/201,359".

*Primary Examiner*—Gregory D Thompson
(74) *Attorney, Agent, or Firm*—Klein, O'Neill & Singh, LLP

(57) ABSTRACT

The disclosed embodiments include a plurality of plenums for distributing cooling air throughout the switch. The switch is divided into separate cooling domains. Each PCB receives a separate supply of cooling air, so that no PCB is located upstream or downstream from another PCB. The present embodiments thus eliminate the problem of stack rise, which can decrease switch performance.

18 Claims, 18 Drawing Sheets

U.S. PATENT DOCUMENTS

| | | |
|---|---|---|
| 7,508,663 B2 | 3/2009 | Coglitore |
| 7,542,287 B2 | 6/2009 | Lewis, II et al. |
| 2005/0047098 A1* | 3/2005 | Garnett et al. ............... 361/735 |
| 2005/0168945 A1* | 8/2005 | Coglitore .................... 361/695 |
| 2005/0237716 A1 | 10/2005 | Chu et al. |
| 2005/0280986 A1* | 12/2005 | Coglitore et al. ............ 361/687 |
| 2006/0002080 A1* | 1/2006 | Leija et al. .................. 361/687 |
| 2006/0012955 A1* | 1/2006 | Vinson et al. ............... 361/695 |
| 2006/0126292 A1* | 6/2006 | Pfahnl et al. ................ 361/695 |
| 2006/0176664 A1* | 8/2006 | Casebolt ..................... 361/687 |
| 2007/0171610 A1 | 7/2007 | Lewis |
| 2007/0173189 A1 | 7/2007 | Lewis |
| 2007/0254583 A1 | 11/2007 | Germagian et al. |
| 2008/0002358 A1* | 1/2008 | Casebolt ..................... 361/687 |
| 2008/0291625 A1 | 11/2008 | Rathbun, II et al. |
| 2008/0316702 A1 | 12/2008 | Donowho et al. |
| 2009/0059523 A1 | 3/2009 | Mallia et al. |
| 2009/0061755 A1 | 3/2009 | Calder et al. |
| 2009/0122484 A1 | 5/2009 | Caveney |

* cited by examiner

APPARATUS AND METHODS FOR COOLING NETWORK SWITCHES

BACKGROUND

1. Technical Field

The present disclosure relates to cooling in network switches.

2. Related Art

A computer network is an interconnected group of computers and other devices, such as storage devices. All networks are made up of basic hardware building blocks to interconnect network nodes. These building blocks include network interface cards (NICS), bridges, hubs, switches, and routers, for example. Each device in the network is called a node. All nodes include at least one port. An interconnect medium, such as copper wiring or optical cabling, extends between device ports.

FIG. 1 is a schematic block diagram of a typical network 30. The network 30 includes a plurality of interconnected devices, including first and second switches 32, 34, a host system 33 coupled to the second switch 34, a disk array 36 coupled to the first switch 32, and a server 38 coupled to both switches 32, 34 and to storage 40.

A switch is a multi-port device in which each port manages a simple point-to-point connection between itself and its attached system. Each switch port can be attached to a host system, a server, a peripheral, an I/O subsystem, a bridge, a hub, a router, or even another switch. A switch receives data packets from one port and automatically routes them to other ports based on addresses contained in the packets.

Switches include a plurality of modules supported by a chassis. The modules are printed circuit boards (PCBs), and include one or more integrated circuit (IC) devices, or chips, on at least one surface. In operation the chips generate heat that must be dissipated in order to keep the switch operating efficiently. One problem that plagues switch cooling is "stack rise." Stack rise occurs when cooling air passes over multiple chips in succession. Each chip heats the passing cooling air so that downstream chips always receive warmer, or preheated, cooling air. These downstream chips are more susceptible to overheating, which decreases switch performance.

SUMMARY

The preferred embodiments of the present apparatus and methods for cooling network switches have several features, no single one of which is solely responsible for their desirable attributes. Without limiting the scope of the present embodiments as expressed by the claims that follow, their more prominent features now will be discussed briefly. After considering this discussion, and particularly after reading the section entitled "Detailed Description of the Preferred Embodiments," one will understand how the features of the present embodiments provide advantages, which include a decreased likelihood of a decline in switch performance due to overheating.

One aspect of the present apparatus and methods for cooling network switches includes the realization that stack rise is detrimental to maintaining switch performance. Accordingly, if stack rise could be eliminated from a switch the switch would be less likely to suffer a decline in performance.

One embodiment of the present network switch comprises a plurality of spaced printed circuit boards (PCBs), a plurality of fan modules configured to force cooling air through the switch, and a plurality of plenums configured to carry the forced cooling air. Each plenum is associated with at least one of the fan modules. The plenums are configured to distribute the cooling air throughout the switch so that no PCB is located upstream from any other PCB, and therefore no PCB preheats the cooling air received by any other PCB.

In one embodiment of the present methods for cooling a network switch, the switch includes a plurality of spaced printed circuit boards (PCBs). Each PCB includes at least one integrated circuit (IC) device thereon. The method comprises the steps of forcing cooling air through the switch such that each of the plurality of spaced PCBs receives cooling air, and distributing the cooling air throughout the switch such that no PCB is located upstream from any other PCB, and therefore no PCB preheats the cooling air received by any other PCB.

Another embodiment of the present network switch comprises a plurality of spaced printed circuit boards (PCBs), a plurality of fan modules configured to force cooling air through the switch, a plurality of plenums configured to carry the forced cooling air. Each plenum is associated with at least one of the fan modules. The plenums are configured to distribute the cooling air throughout the switch so that cooling air entering the switch passes across only one of the PCBs before exiting the switch.

BRIEF DESCRIPTION OF THE DRAWINGS

The preferred embodiments of the present apparatus and methods for cooling network switches now will be discussed in detail with an emphasis on highlighting the advantageous features. These embodiments depict the novel and non-obvious apparatus and methods shown in the accompanying drawings, which are for illustrative purposes only. These drawings include the following figures, in which like numerals indicate like parts.

DETAILED DESCRIPTION

Figure 1:
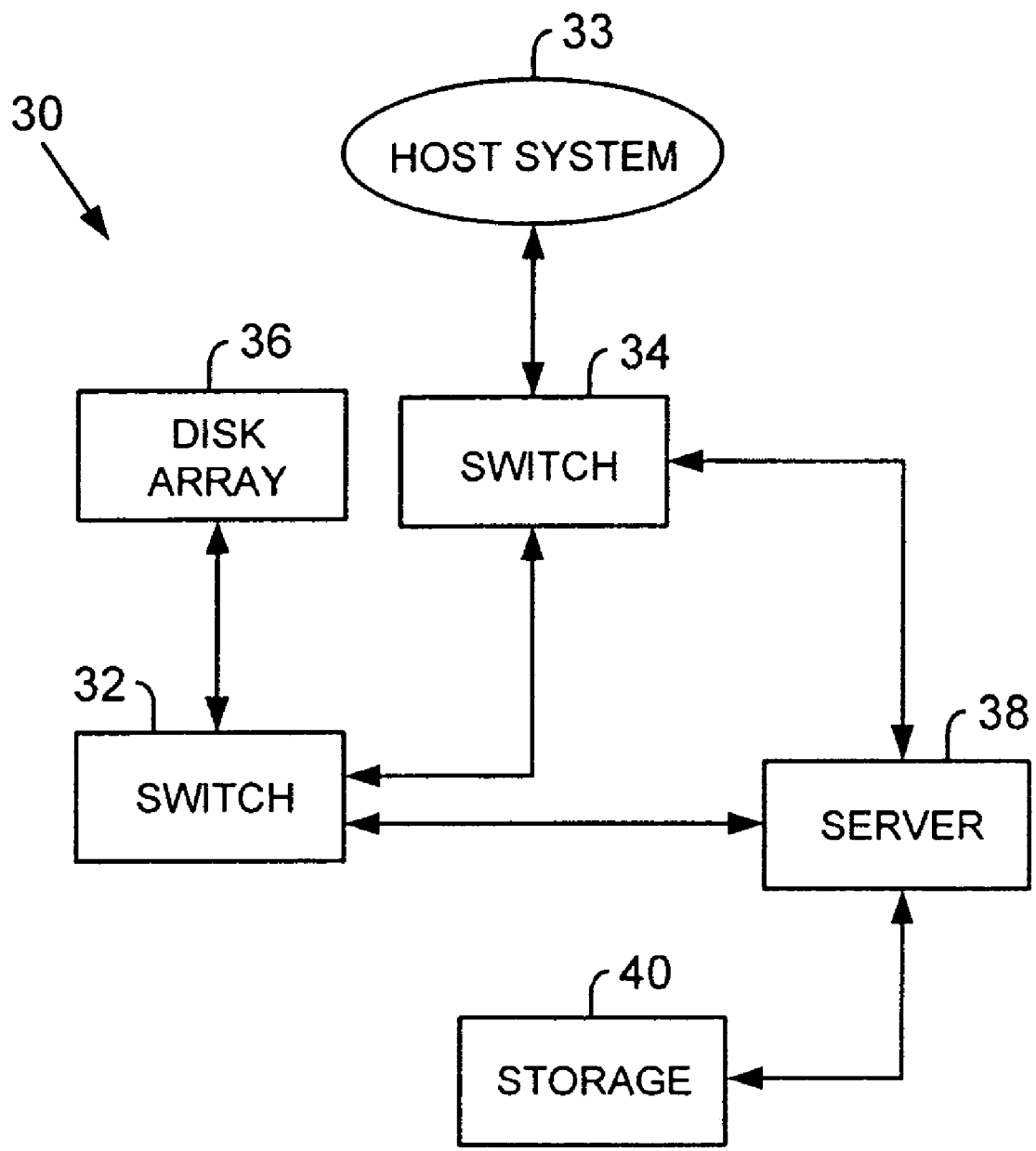
FIG. 1 is a schematic block diagram of a typical computer network.

The following detailed description describes the present embodiments with reference to the drawings. In the drawings, reference numbers label elements of the present embodiments. These reference numbers are reproduced below in connection with the discussion of the corresponding drawing features.

Figure 2:
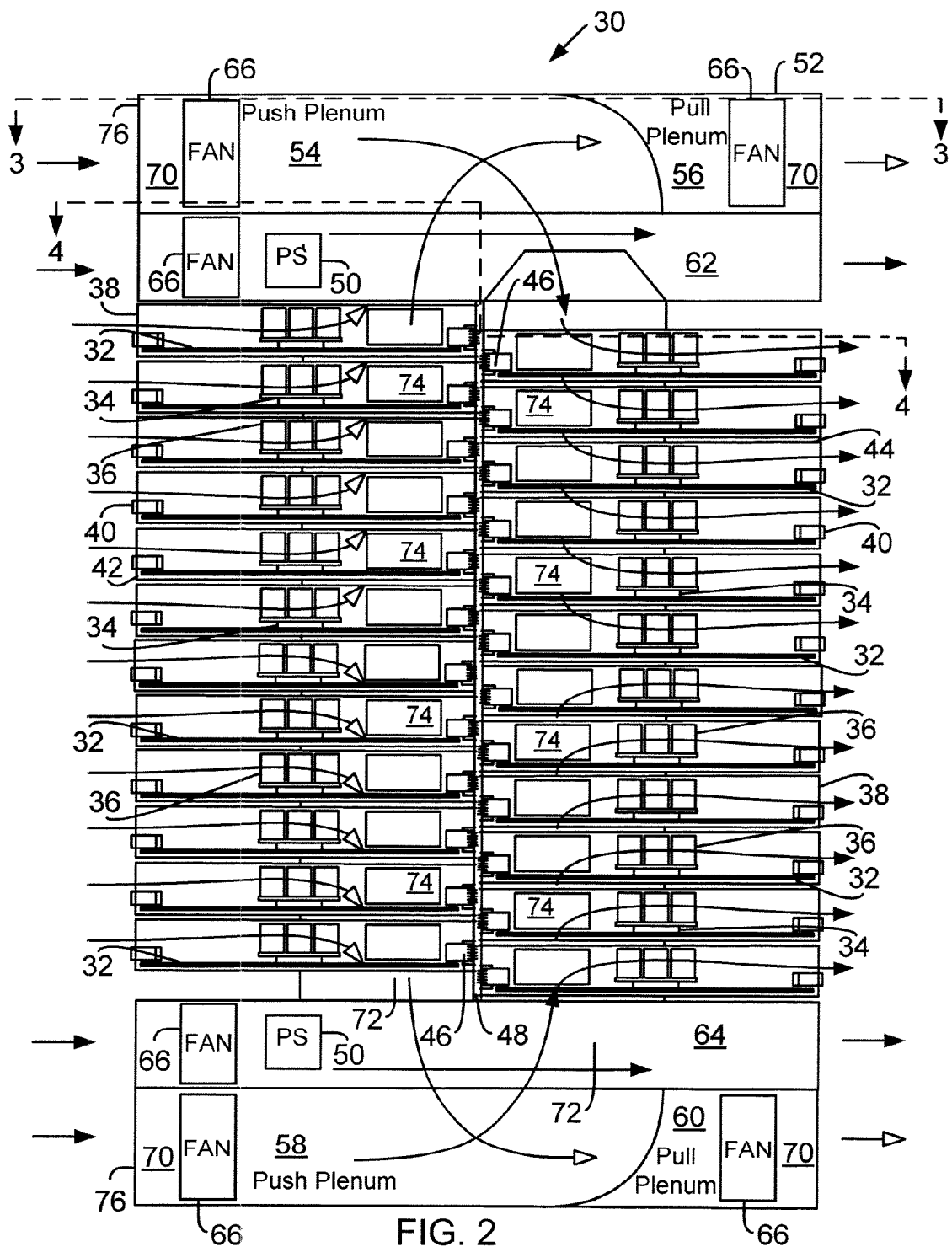
FIG. 2 is a schematic, side elevation view of one embodiment of the present network switch illustrating a method and apparatus for cooling the switch.

FIG. 2 illustrates one embodiment of the present network switch 30, and a method and apparatus for cooling the switch 30. The switch 30 includes a plurality of spaced modules 32. Each module 32 is a printed circuit board (PCB), and includes one or more integrated circuit (IC) devices 34, or chips, on at least one surface. The ICs 34 generate heat, which must be dissipated in order to prevent a decrease in the switch's performance. In the illustrated embodiment, each IC 34 includes a heat sink 36, which draws heat away from the IC 34. In certain embodiments the ICs 34 may not include heat sinks 36, or some ICs 34 may include heat sinks 36 and some may not.

With further reference to FIG. 2, each module 32 includes an enclosure 38. The enclosures 38 help to separate airflow between the modules 32. The separation in airflow contributes to the cooling effectiveness of the present embodiments, as discussed in more detail below. Those of ordinary skill in the art will appreciate that in some embodiments of the present switch 30 some or all of the modules 32 may not include enclosures 38. In fact, in many cases the modules 32 themselves may help to separate airflow between modules 32.

With further reference to FIG. 2, each module 32 further includes at least one port 40 at a first edge thereof. In certain other embodiments, however, some of the modules may not include external ports. Although not visible in FIG. 2, each module 32 may include ports 40 extending across the switch 30 (into the plane of the paper in FIG. 2). The ports 40 extend along the front face 42 and back face 44 of the switch 30 and are configured to receive cabling (not shown) to enable the switch 30 to communicate with other network devices. A second edge of each module 32, opposite the first edge, further includes at least one midplane 48 connector 46 for connecting the PCB 32 to a midplane 48. A plurality of power supplies 50 provides power for the switch 30. Although only two power supplies 50 are shown in FIG. 2, those of ordinary skill in the art will appreciate that the switch 30 may include any number of power supplies 50. A housing or chassis 52 supports and contains the modules 32.

The switch 30 includes a plurality of plenums 54, 56, 58, 60, 62, 64 configured to carry cooling air. The embodiment of FIG. 2 includes six separate plenums 54, 56, 58, 60, 62, 64. Alternative embodiments, including those illustrated in FIGS. 6-10, may include fewer or more plenums. The plenums 54, 56, 58, 60 in FIG. 2 are configured to deliver cooling air to or from the modules 32, and the plenums 62, 64 are configured to deliver cooling air to or from the power supplies 50. For simplicity, in the present disclosure the plenums 54, 56, 58, 60 are referred to as module cooling plenums, and the plenums 62, 64 are referred to as auxiliary cooling plenums. In alternative embodiments, the auxiliary cooling plenums 62, 64 may be configured to deliver cooling air to something other than power supplies 50, such as high-powered modules requiring a separate air stream.

Figure 3:
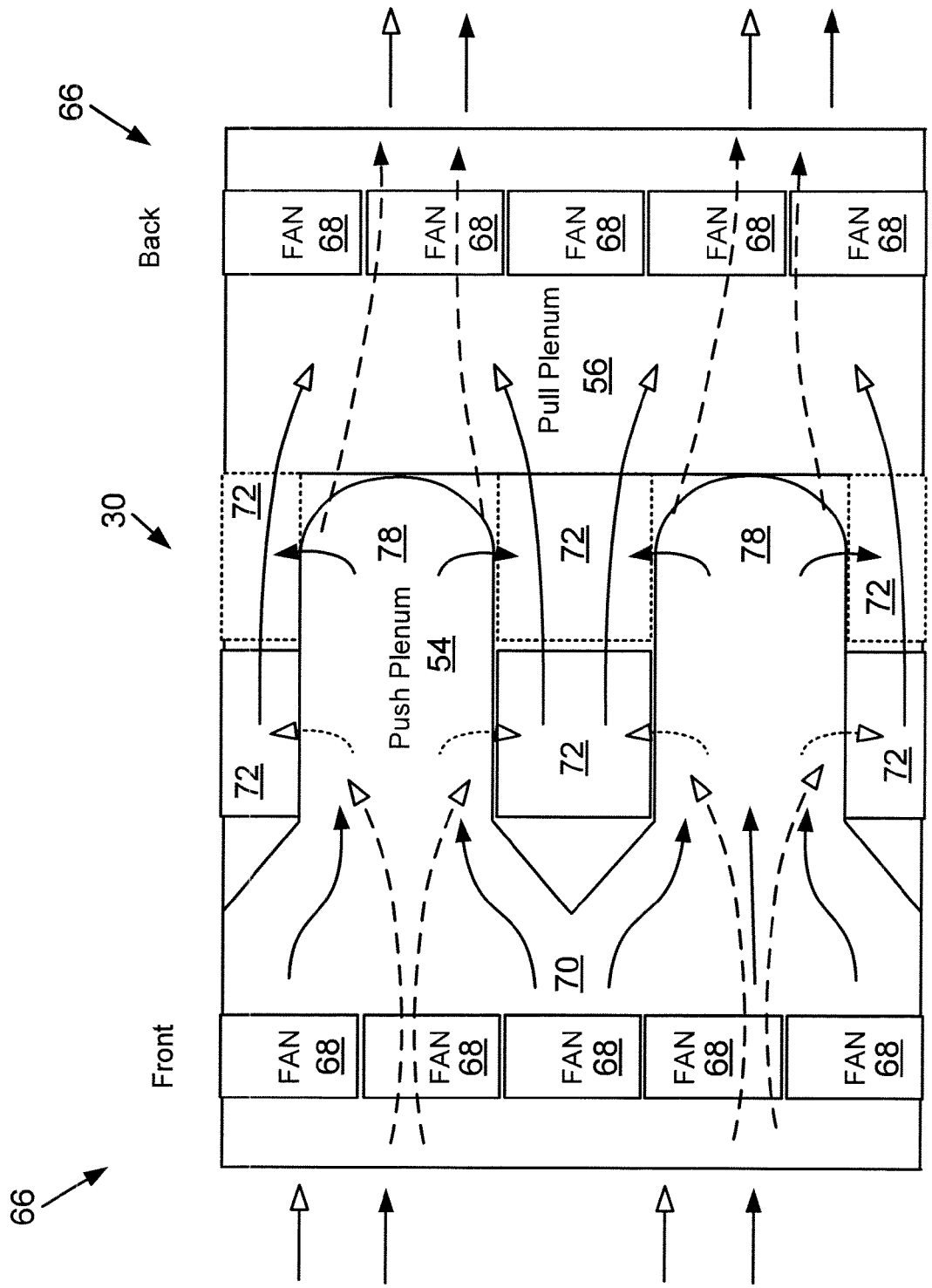
FIG. 3 is a schematic, cross-sectional, top plan view of the switch of FIG. 1, taken through the line 3-3 in FIG. 1.

Each of the plenums 54, 56, 58, 60, 62, 64 cooperates with a fan module 66 that forces cooling air through the plenum. With reference to FIG. 3, which is a cross-sectional, top plan view of one embodiment of the switch 30 of FIG. 2, each fan module 66 may include a plurality of fans 68 extending across the switch 30. In alternative embodiments, some fan modules may include a single fan 68. In the present disclosure, the term fan module is used broadly to cover any number of fans associated with a single plenum.

With reference to FIG. 2, in the illustrated embodiment the module cooling plenums 54, 56, 58, 60 are substantially L-shaped. Each includes a first portion 70 extending across the switch 30 in a front-to-back direction, and a second portion 72 extending through the switch 30 in a direction perpendicular to the PCBs 32. A first subset of the module plenums 54, 56, 58, 60 is configured to deliver cooling air to the PCBs 32 at the front of the switch 30, and a second subset of the module 32 plenums is configured to deliver cooling air to the PCBs 32 at the back of the switch 30.

The pull plenums 56, 60 are so named because the fan modules 66 associated with those plenums are located at the outlet ends of the plenums 56, 60 and are configured to pull air into and through the plenums, as indicated in FIG. 2 by the arrows having hollow arrowheads. In contrast, the push plenums 54, 58 are so named because the fan modules 66 associated with those plenums are located at the inlet ends of the plenums 54, 58 and are configured to push air through the plenums, as indicated in FIG. 2 by the arrows having solid arrowheads.

In the illustrated configuration, the upper pull plenum 56 extends upward through the PCBs 32 in the upper-front quadrant of the switch 30, and then horizontally along the top of the switch 30 from the front side of the midplane 48 toward the back of the switch 30. The vertical portion 72 of the plenum 56 includes a plurality of openings 74 along its length that enable the cooling air to flow into the plenum 56 from the modules 32 in the upper-front quadrant of the switch 30. The fan module 66 in the upper pull plenum 56 generates a pressure drop between the modules 32 in the upper-front quadrant and the horizontal portion 70 of the upper pull plenum 56. The fan module 66 thus sucks cooling air into the upper-front quadrant through openings (not shown) in the front of the switch 30. The air flows over the modules 32 and then into the vertical portion 72 of the upper pull plenum 56 through the openings 74 in the vertical portion 72. The air flows through the upper pull plenum 56 before being discharged at the back of the switch 30. The upper pull plenum 56 together with the modules 32 in the upper-front quadrant of the switch 30 defines an upper pull domain.

In the illustrated configuration, the lower pull plenum 60 extends downward through the PCBs 32 in the lower-front quadrant of the switch 30, and then horizontally along the bottom of the switch 30 from the front side of the midplane 48 toward the back of the switch 30. The vertical portion 72 of the plenum 60 includes a plurality of openings 74 along its length that enable the cooling air to flow into the plenum 60 from the modules 32 in the lower-front quadrant of the switch 30. The fan module 66 in the lower pull plenum 60 generates a pressure drop between the modules 32 in the lower-front quadrant and the horizontal portion 70 of the lower pull plenum 60. The fan module 66 thus sucks cooling air into the lower-front quadrant through openings in the front of the switch 30. The air flows over the modules 32 and then into the vertical portion 72 of the lower pull plenum 60 through the openings 74 in the vertical portion 72. The air flows through the lower pull plenum 60 before being discharged at the back of the switch 30. The lower pull plenum 60 together with the modules 32 in the lower-front quadrant of the switch 30 defines a lower pull domain.

In the illustrated configuration, the upper push plenum 54 extends horizontally along the top of the switch 30 from the front of the switch 30 toward the back side of the midplane 48. The upper push plenum 54 then extends downward through the PCBs 32 in the upper-rear quadrant of the switch 30. The vertical portion 72 of the plenum 54 includes a plurality of openings 74 along its length that enable the cooling air to flow out of the plenum 54 and over the modules 32 in the upper-rear quadrant of the switch 30. The fan module 66 in the upper push plenum 54 generates a pressure drop between air at an inlet 76 of the upper push plenum 54 and air within the upper push plenum 54. The fan module 66 thus sucks cooling air into the upper push plenum 54, forces the air through the plenum 54, and then forces the air through openings 74 in the vertical portion 72 of the plenum 54 and over the modules 32 in the upper-rear quadrant. The air flows over the modules 32 in the upper-rear quadrant before being discharged at the back of the switch 30. The upper push plenum 54 together with the modules 32 in the upper-rear quadrant of the switch 30 defines an upper push domain.

In the illustrated configuration, the lower push plenum 58 extends horizontally along the bottom of the switch 30 from the front of the switch 30 toward the back side of the midplane 48. The lower push plenum 58 then extends upward through the PCBs 32 in the lower-rear quadrant of the switch 30. The vertical portion 72 of the plenum 58 includes a plurality of openings 74 along its length that enable the cooling air to flow out of the plenum 58 and over the modules 32 in the lower-rear quadrant of the switch 30. The fan module 66 in the lower push plenum 58 generates a pressure drop between air at an inlet 76 of the lower push plenum 58 and air within the lower push plenum 58. The fan module 66 thus sucks cooling air into the lower push plenum 58, forces the air through the plenum 58, and then forces the air through openings 74 in the vertical portion 72 of the plenum 58 and over the modules 32 in the lower-rear quadrant. The air flows over the modules 32 in the lower-rear quadrant before being discharged at the back of the switch 30. The lower push plenum 58 together with the modules 32 in the lower-rear quadrant of the switch 30 defines a lower push domain.

With continued reference to FIG. 2, in the pull domains each vertical portion 72 of each plenum 56, 60 includes a separate opening 74 corresponding to each module 32. Suction generated by the fan modules 66 thus draws air separately over each module 32. Similarly, in the push domains each vertical portion 72 of each plenum 54, 58 includes a separate opening 74 corresponding to each module 32. Air pushed by the fan modules 66 thus passes separately over each module 32. Advantageously, in the illustrated cooling air distribution no module 32 is located upstream or downstream of another module 32. Instead, cooling air passes over each module 32 separately so that it is not pre-heated by passing first over one module 32 and then over another module 32. Further, the enclosures 38 separate the airflow between modules 32, so that there is no mixing of cooling air streams. The present switch 30 and methods for cooling the switch 30 thus eliminate the problem of stack rise that plagues other switches and network devices. Further, each of the cooling domains are isolated from one another, so that heated air from one domain is not carried into another domain. Those of ordinary skill in the art will appreciate that in certain embodiments the modules 32 themselves may perform the function of separating the airflow between modules 32.

In the illustrated embodiment, the openings 74 are represented as being relatively large and rectangular. Those of ordinary skill in the art will appreciate that the openings 74 could have other configurations. For example, the openings could have a different size and/or shape. The openings could also be small perforations, rather than large openings.

Figure 4:
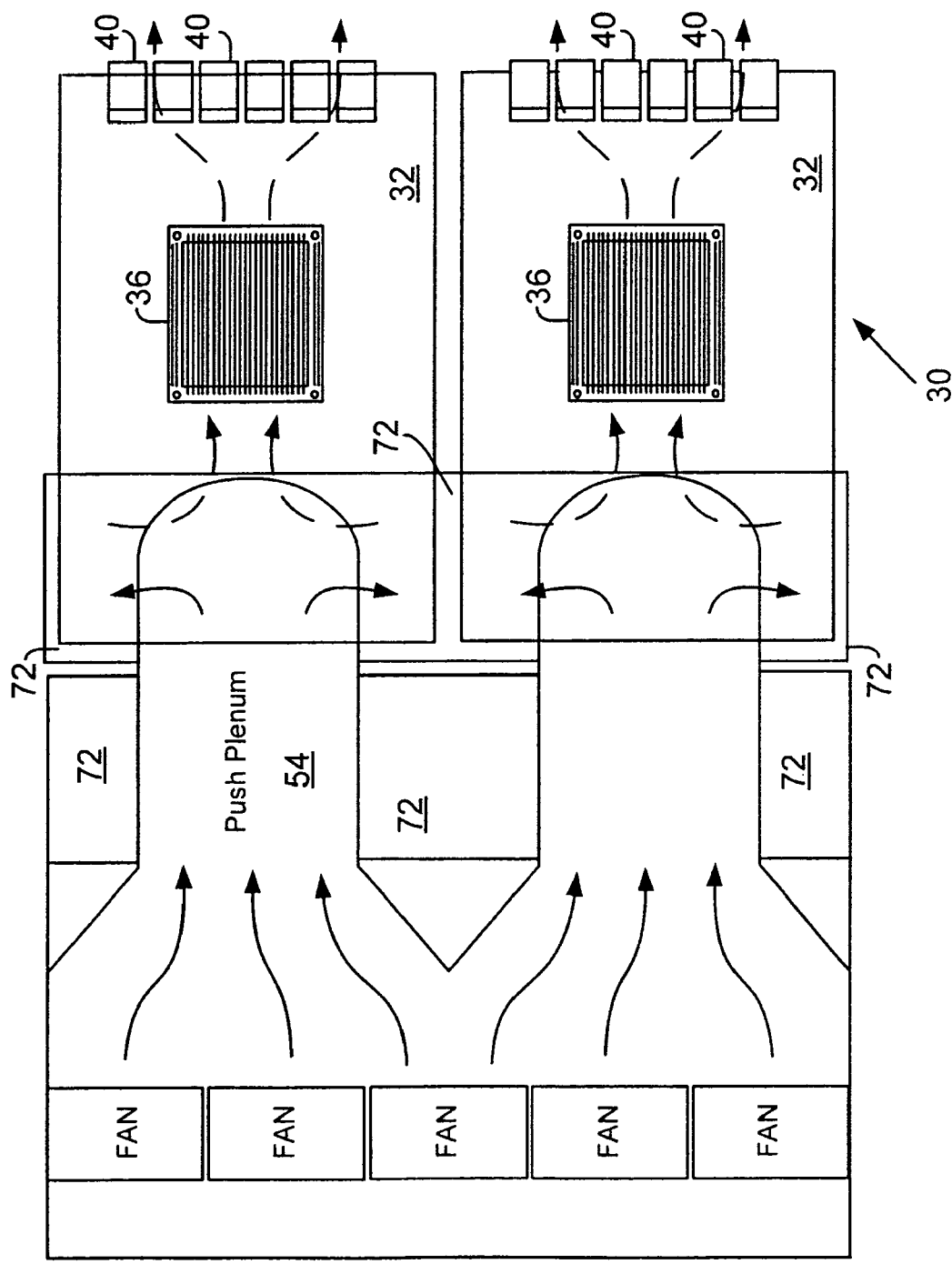
FIG. 4 is a schematic, cross-sectional, top plan view of the switch of FIG. 1, taken through the line 4-4 in FIG. 1.

FIG. 3 is a cross-sectional, top plan view of one embodiment of the switch 30 of FIG. 2, taken through the line 3-3 in FIG. 2. FIG. 4 is a cross-sectional, top plan view of one embodiment of the switch 30 of FIG. 2, taken through the line 4-4 in FIG. 2. FIGS. 3 and 4 illustrate the pattern of air distribution in the switch 30 from the upper perspective. In FIG. 3, the solid arrows indicate air that is flowing in the upper plenums 54, 56, and the dashed arrows indicate air that is flowing across the modules 32, since the modules 32 are not visible in FIG. 3. FIGS. 3 and 4 further illustrate one possible configuration for each plenum, in which each plenum includes three vertical air distribution channels 72. Other embodiments may include a different number of vertical air distribution channels for each module plenum 54, 56, 58, 60 such as two vertical air distribution channels per plenum. Accordingly, FIGS. 3 and 4 should not be interpreted as limiting.

In FIG. 3, the arrows having solid arrowheads illustrate the pattern of air distribution in the push domains. Cooling air enters the switch 30 from the front and flows through the fan module 66 and into the horizontal portion 70 of the push plenum 54, 58. With reference to FIG. 2, the push plenums 54, 58 are located above and below the modules 32. With reference to FIG. 3, within the horizontal portion 70 of the push plenum 54, 58 the air converges into first and second fingers 78 before entering first, second and third vertical air distribution channels 72. The air distribution channels 72 are arranged across the switch 30 with channels at either side and channels extending through the side-to-side center of the switch 30. As shown in FIG. 4, after flowing vertically through the air distribution channels 72 the cooling air exits the channels 72 through the openings 74 (FIG. 2) and flows over the modules 32 at the rear of the switch 30 before exiting the switch 30 at the rear.

Figure 5:
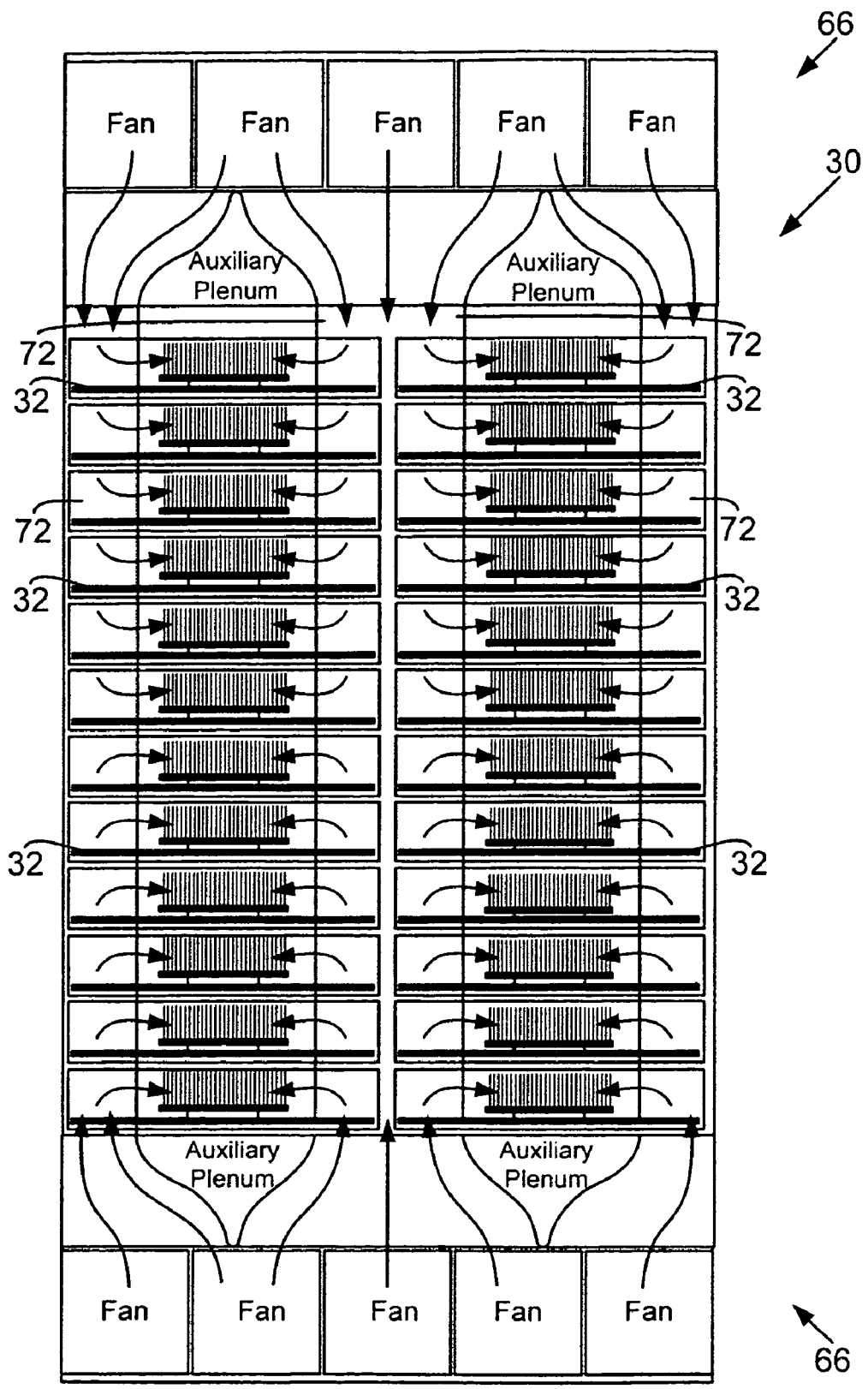
FIG. 5 is a schematic, rear elevation view of the push domain of the switch of FIG. 1.

FIG. 5 is a rear elevation view of the push domains of the switch 30 of FIG. 2. The pull domains have been removed for clarity.

The arrows in FIG. 5 illustrate the pattern of air distribution in the push domains from the rear perspective. Cooling air exits the fan modules 66 and is forced into the air distribution channels 72 through the openings 74 (FIG. 2). After flowing vertically through the air distribution channels 72 the cooling air exits the air distribution channels 72 through the openings 74 (FIG. 2) and flows over the modules 32 at the rear of the switch 30 before exiting the switch 30 at the rear.

With reference to FIG. 3, the arrows having hollow arrowheads illustrate the pattern of air distribution in the pull domains. Cooling air enters the switch 30 from the front and flows over the modules 32 (not visible in FIG. 3) at the front of the switch 30. The cooling air then converges between the vertical air distribution channels 72 and enters the channels 72. After flowing vertically through the air distribution channels 72 the cooling air exits the channels 72 through the openings 74 (FIG. 2) and flows into the pull plenum 56, 60. The cooling air then flows through the pull plenum 56, 60 and through the fan module 66 before exiting the switch 30 at the rear.

With reference to FIG. 2, the switch 30 further includes upper and lower auxiliary cooling plenums 62, 64. Each of the auxiliary plenums 62, 64 is substantially horizontal, and extends through the switch 30 from front to back. A fan module 66 in each auxiliary plenum 62, 64 sucks in cooling air from the front of the switch 30, forces the air through the plenum and discharges it at the back of the switch 30. As the cooling air flows through the plenum it flows over the power supply 50 and keeps the power supply 50 cool. In the illustrated embodiment, the fan modules 66 in the upper and lower auxiliary plenums 62, 64 are located adjacent the front of the switch 30, which is also the inlet side of the switch 30. Those of ordinary skill in the art will appreciate that the fan modules 66 could be located adjacent the back of the switch 30, and/or the direction of airflow through the switch 30 generated by the fan modules 66 could be reversed (back to front). Those of ordinary skill in the art will also appreciate that fan modules 66 could be located adjacent both the front and the back of the switch 30.

Figure 6:
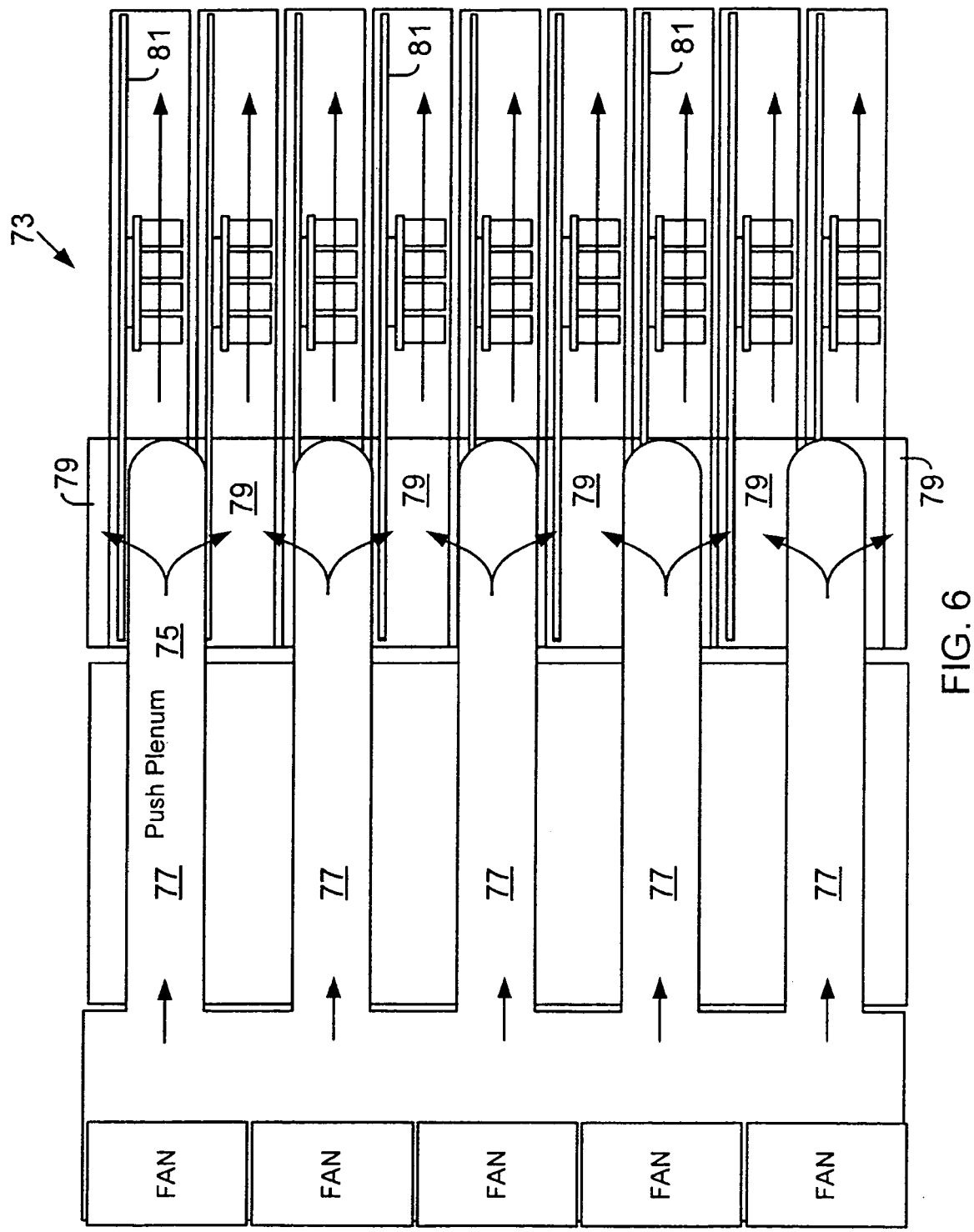
FIG. 6 is a schematic, cross-sectional, top plan view of an alternate configuration for the present switch.
Figure 7:
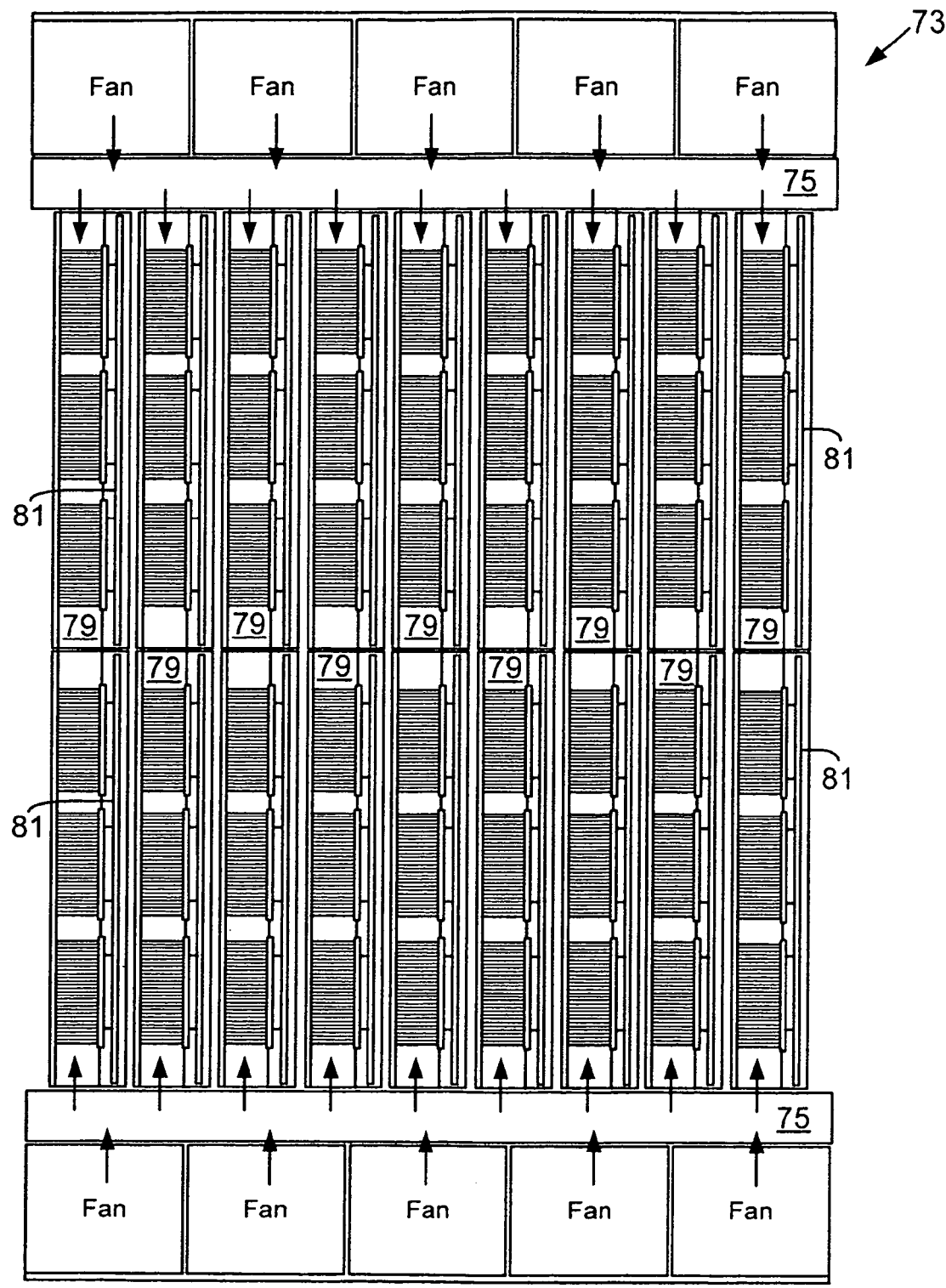
FIG. 7 is a schematic, rear elevation view of the switch of FIG. 6.

FIGS. 6 and 7 illustrate an alternate configuration for the present switch 73. FIG. 6 is a schematic, cross-sectional, top plan view, and FIG. 7 is a schematic, rear elevation view. Further, FIGS. 6 and 7 illustrate only the push domains. The pull domains have been removed for clarity. With reference to FIG. 6, the push plenums 75 include five fingers 77, in contrast to the two fingers 78 in the switch 30 of FIG. 3. Cooling air entering the push plenums 75 converges into the five fingers 77 and then enters the vertical air distribution channels 79. The switch 73 of FIG. 6 includes six air distribution channels 79 arranged in spaced relation to one another across the switch 73. With reference to FIGS. 6 and 7, after travelling through the air distribution channels 79 the cooling air flows out of openings (not shown) in the channels 79 and then flows across the PCBs 81. In the switch 73 of FIGS. 6 and 7 the PCBs 81 are arranged so that a plane defined by each is parallel to the air distribution channels 79, rather than the perpendicular arrangement of the switch 30 of FIG. 2. With reference to FIG. 7, each module 81 has a dedicated air distribution channel 79, so that each module 81 receives a separate supply of cooling air. Like the switch 30 of FIG. 22, then, the switch 73 of FIGS. 6 and 7 eliminates stack rise. After passing across the modules 81, the cooling air exits the back of the switch 73.

Figure 8:
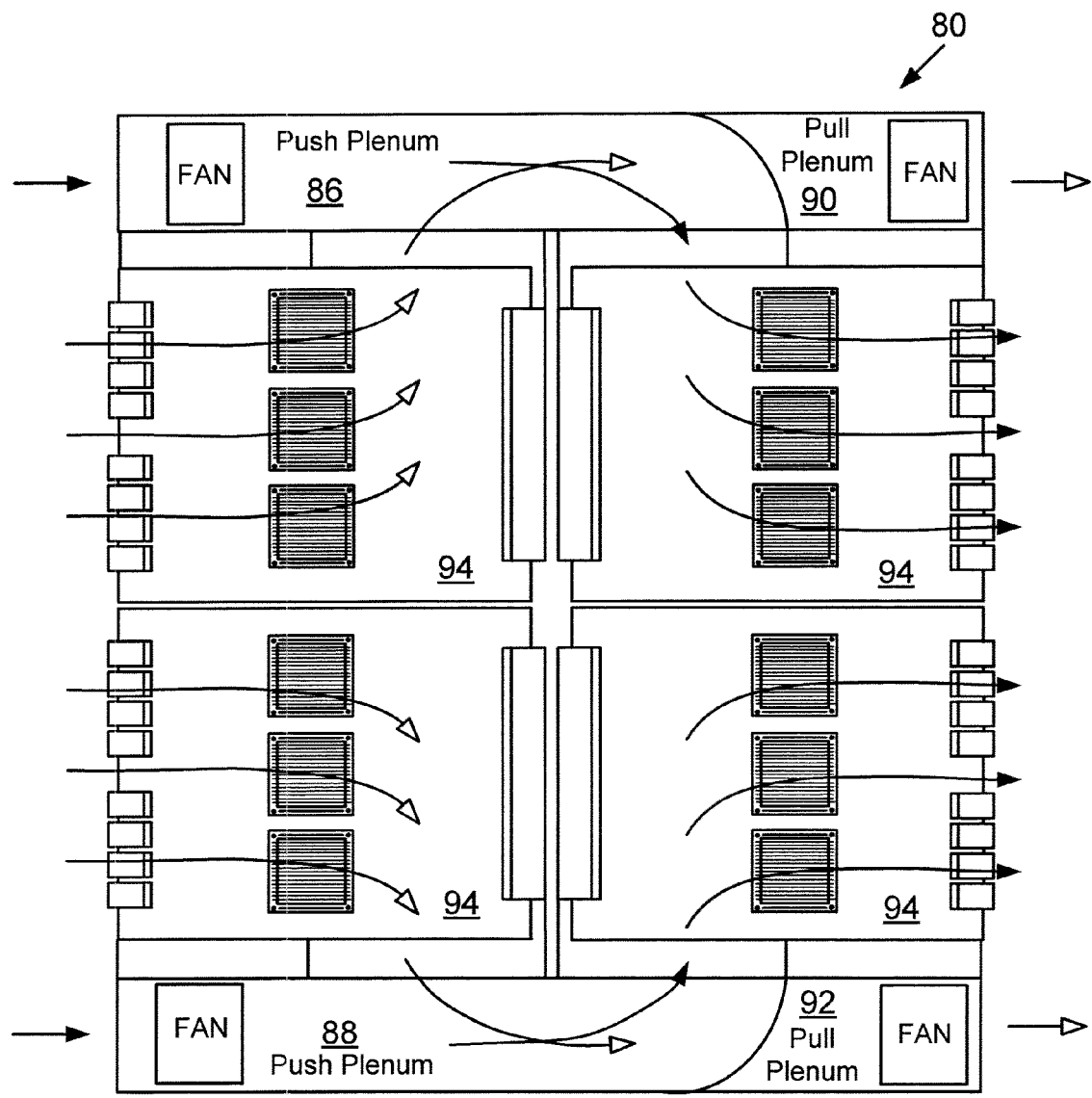
FIG. 8 is a schematic, side elevation view of another embodiment of the present network switch illustrating a method and apparatus for cooling the switch.
Figure 9:
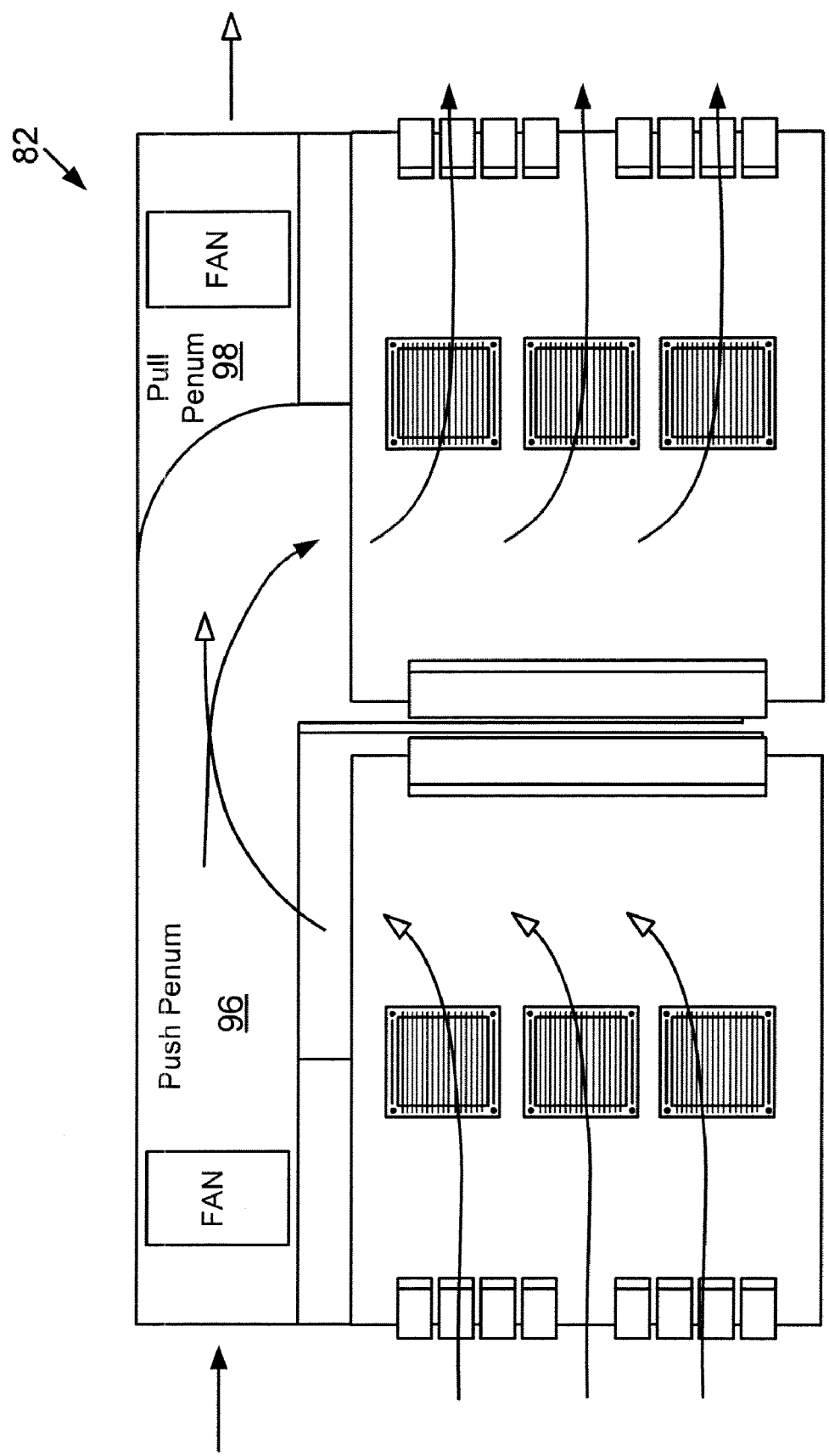
FIG. 9 is a schematic, side elevation view of another embodiment of the present network switch illustrating a method and apparatus for cooling the switch.
Figure 10:
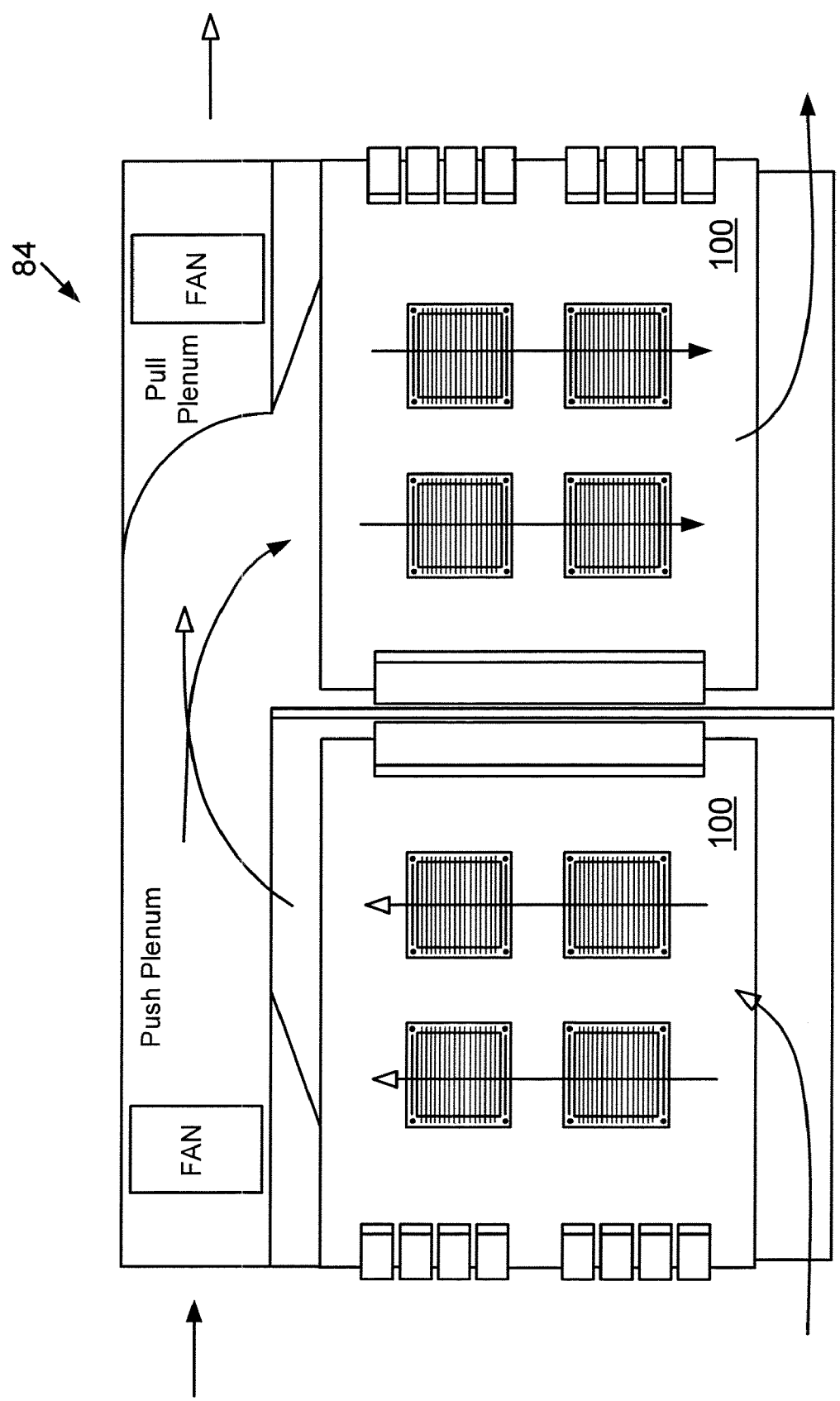
FIG. 10 is a schematic, side elevation view of another embodiment of the present network switch illustrating a method and apparatus for cooling the switch.

FIGS. 8-10 illustrate further embodiments of the present network switch 80, 82, 84 and methods and apparatus for cooling the switches. The embodiments of FIGS. 8-10 apply many of the same cooling principles present in the switch 30 of FIG. 2, and achieve many of the same advantages. With reference to FIG. 8, the switch 80 includes four separate module cooling domains, as in the switch 30 of FIG. 2. The switch 80 of FIG. 8 does not, however, include separate auxiliary cooling plenums/domains. As with the switch 30 of FIG. 2, the switch 80 of FIG. 8 includes upper and lower push plenums 86, 88 and upper and lower pull plenums 90, 92. In FIG. 8, however, each module 94 is oriented vertically instead of horizontally as in FIG. 1. Cooling air enters from the front of the switch 80, passes separately over the modules 94 and through the plenums 86, 88, 90, 92, and exits at the rear of the switch 80. The cooling air flows horizontally over the modules 94. Again, each module 94 receives a separate supply of cooling air, thus eliminating stack rise.

The switch 82 of FIG. 9 is similar to the switch 80 of FIG. 8, except that it includes only two cooling plenums/domains. The illustrated embodiment includes an upper push plenum 96 and an upper pull plenum 98. Alternative embodiments may include a lower push plenum and a lower pull plenum, or one upper plenum and one lower plenum. The switch 84 of FIG. 10 is similar to the switch 82 of FIG. 9, except that the cooling air flows vertically over the modules 100. In the pull domain, the cooling air enters at the bottom of the switch 84 and flows upward over the modules 100. In the push domain, the cooling air flows downward over the modules 100 and exits at the bottom of the switch 84.

Figure 11A:
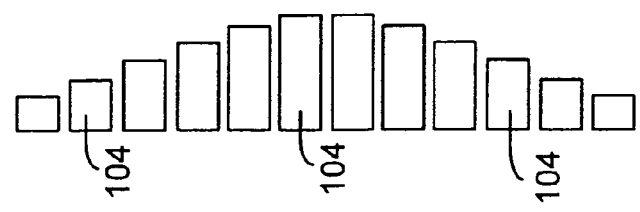
FIG. 11A is a detail view of a portion of the pull domain of FIG. 11.
Figure 11:
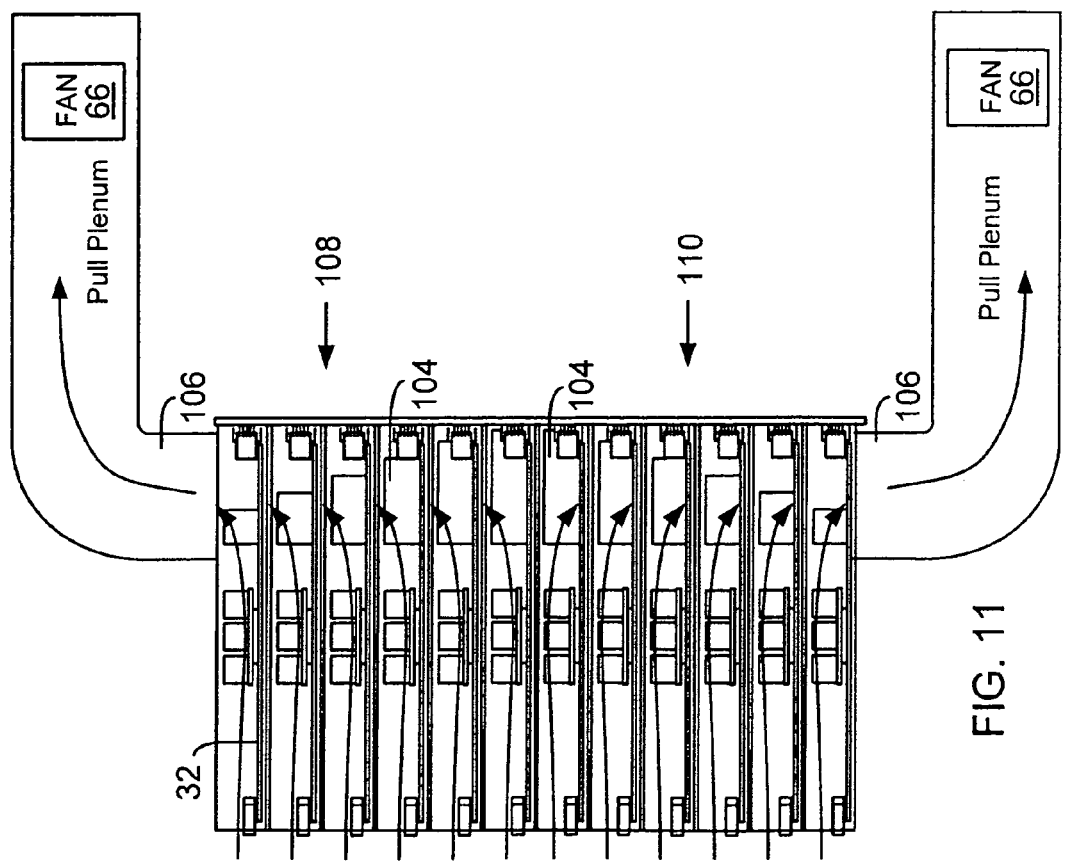
FIG. 11 is a schematic, side elevation view of one embodiment of a pull domain of the present switch.

FIGS. 11 and 11A illustrate an alternative embodiment of pull domains for the present switches. In contrast to the pull domains in the switch 30 of FIG. 2, the openings 104 in the air distribution channels 106 in FIGS. 11 and 11A vary in size. FIG. 11A provides a detail view of the openings 104. In the upper pull domain 108, the openings 104 decrease in size from bottom to top, and in the lower pull domain 110, the openings 104 decrease in size from top to bottom. This arrangement corresponds to the decreasing pressure drop with increasing distance from the fan module 66. The openings 104 closest to the vertical center of the switch are farthest away from their respective fan modules 66. The pressure drop between these openings 104 and their respective fan modules 66 is thus less than the pressure drop between the openings 104 adjacent the top and bottom of the switch and their respective fan modules 66. The variable size openings 104 compensate for these differences in pressure drop. Openings 104 having a relatively large pressure drop have correspondingly small areas, and openings 104 having a relatively small pressure drop have correspondingly large areas. The suctions at each opening are thus substantially equal. The substantially equal suctions contribute to the fan module's ability to draw an approximately equal amount of cooling air over each PCB 32, which provides equal cooling to each PCB 32. In an alternative embodiment, the discrete openings shown in FIGS. 11 and 11A may be replaced with perforations, with a size and/or density of the perforations varying along the length of the air distribution channels.

Figure 12:
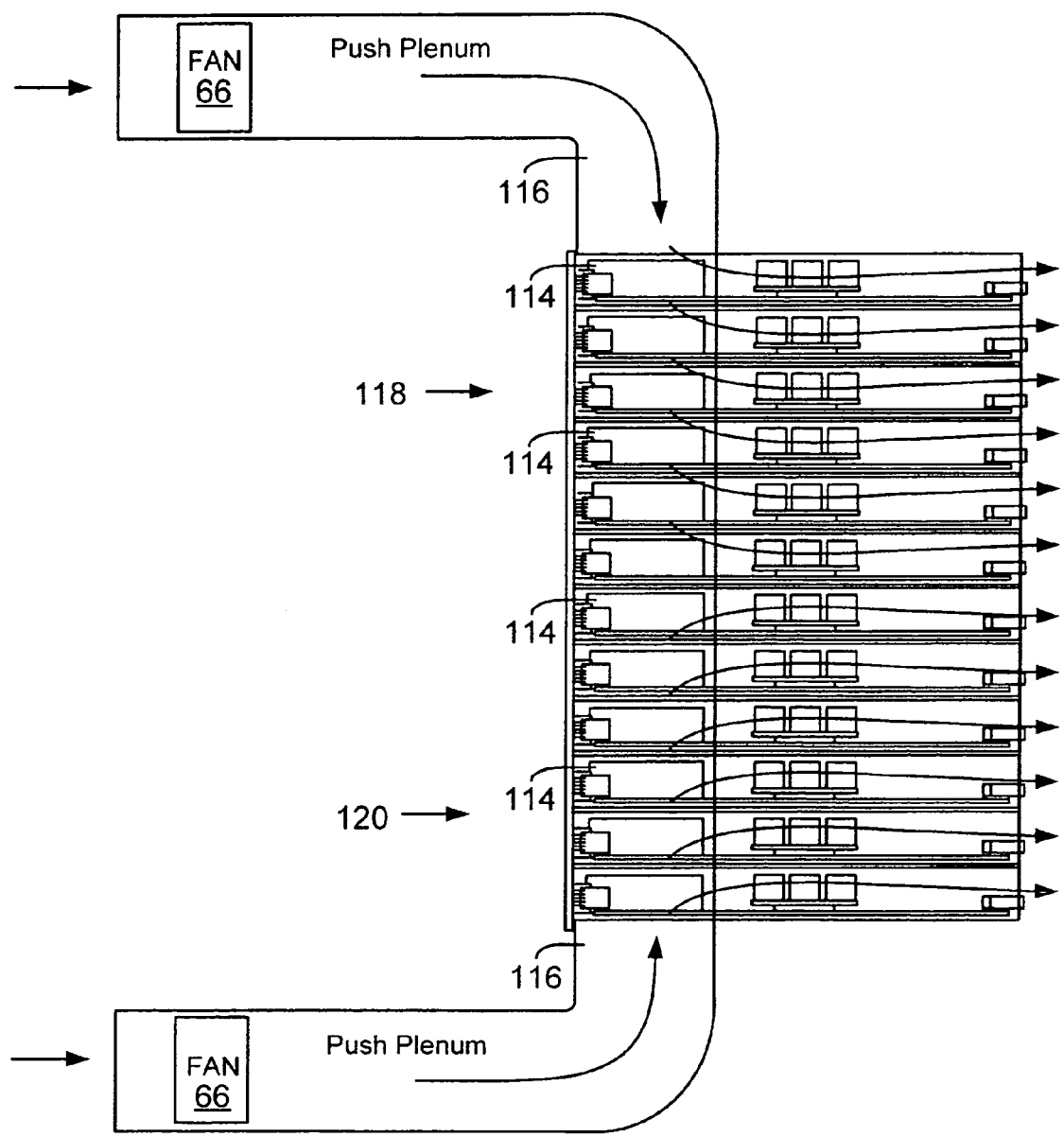
FIG. 12 is a schematic, side elevation view of one embodiment of a push domain of the present switch.
Figure 13:
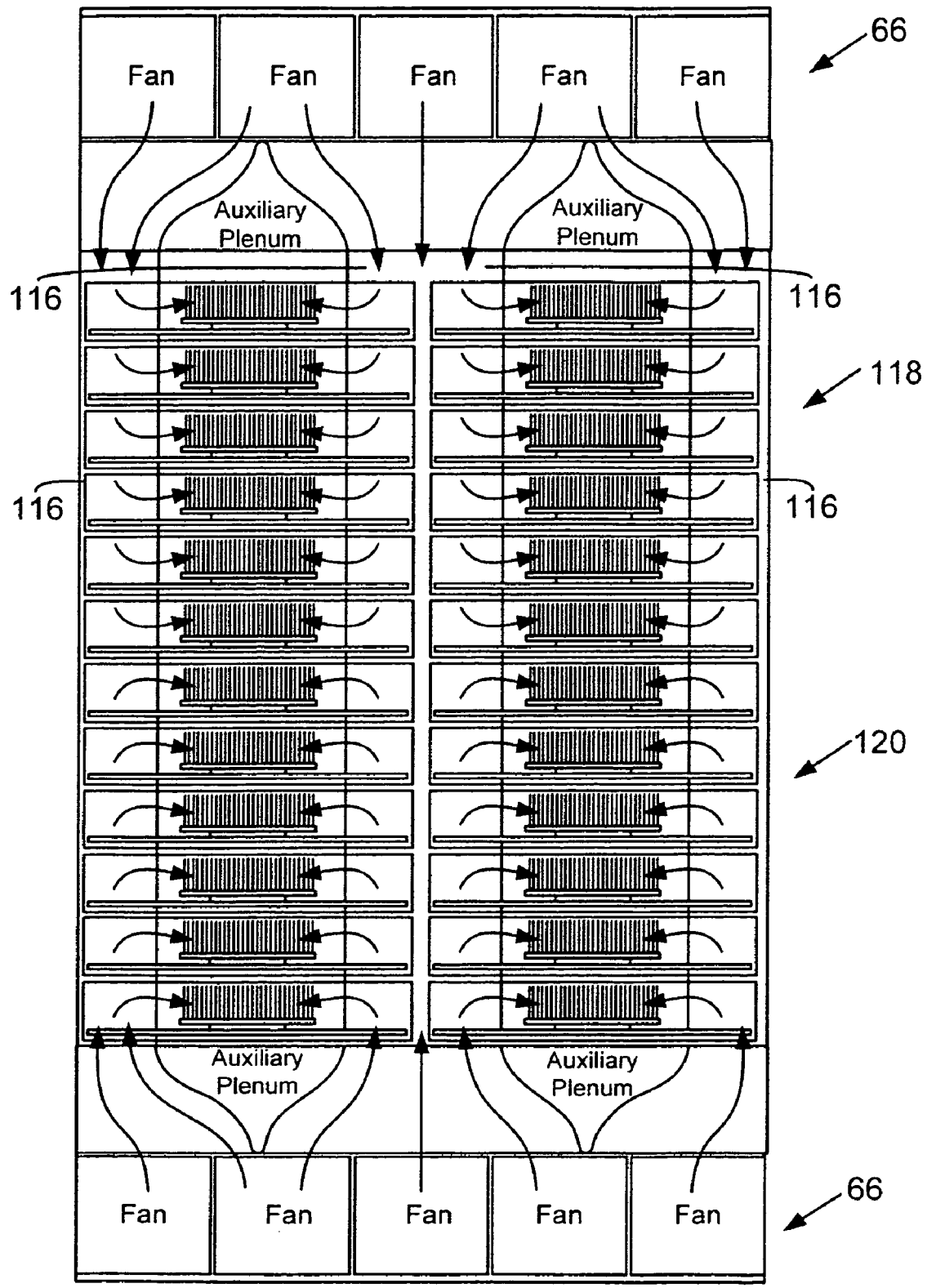
FIG. 13 is a schematic, rear elevation view of the push domain of the switch of FIG. 12.
Figure 14:
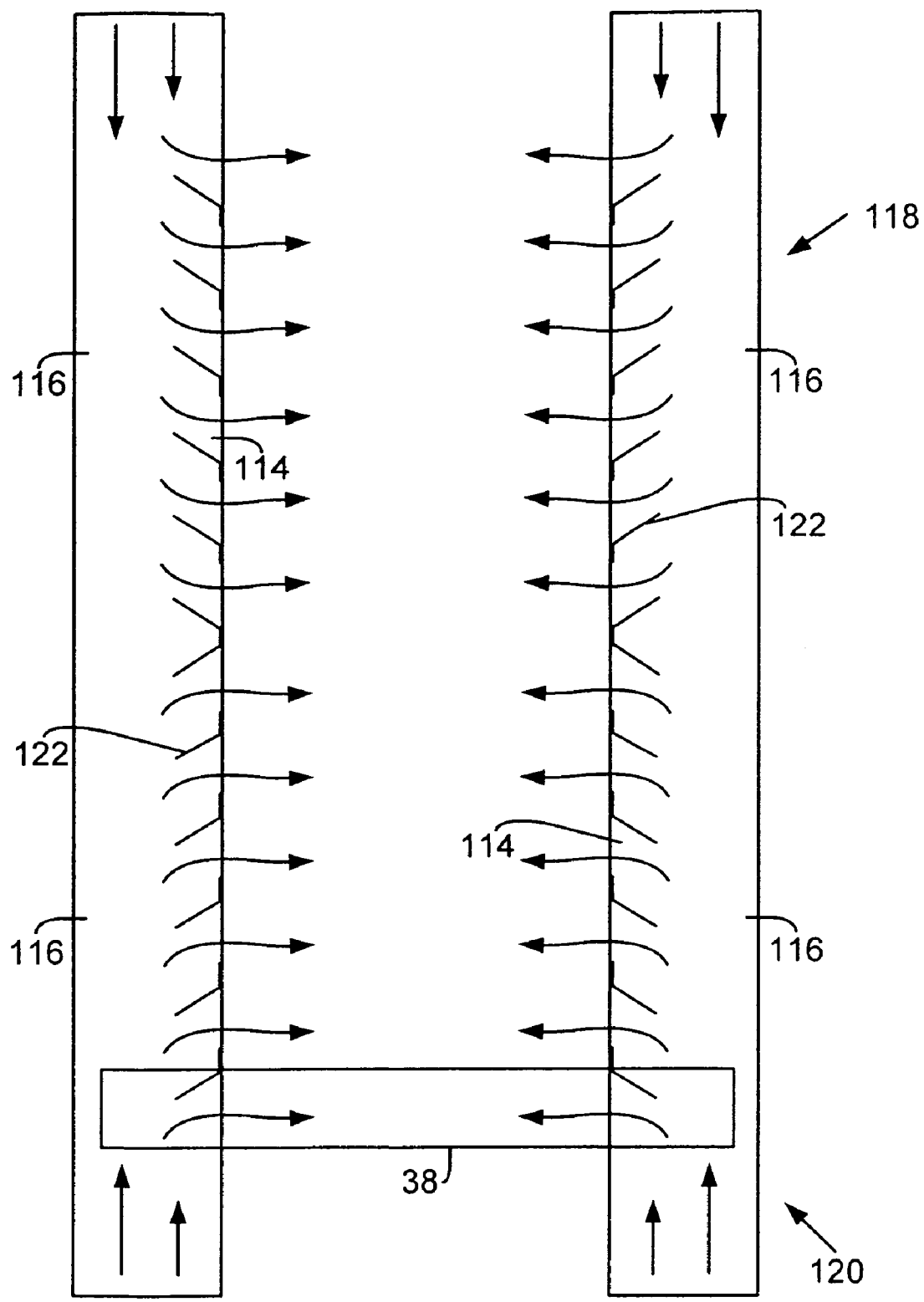
FIG. 14 is a schematic, rear elevation view of the one embodiment of vertical push plenums of the present switch.

FIGS. 12-14 illustrate an alternative embodiment of push domains 118, 120 for the present switches. With reference to FIG. 12, the openings 114 in the air distribution channels 116 are all substantially equal in size. FIG. 13 illustrates the push domains 118, 120 from a rear perspective, and FIG. 14 illustrates four of the air distribution channels 116 of the push domains 118, 120 from the same perspective. FIG. 14 also illustrates one module enclosure 38 for clarity. With reference to FIG. 14, the openings 114 in the air distribution channels 116 include baffles 122. The baffles 122 compensate for the decreasing air velocity with increasing distance from the fan modules 66. In the upper push domain 112 the air in the upper portions of the upper air distribution channels 116 has greater velocity than the air in the lower portions of the upper air distribution channels 116. Similarly, in the lower push domain 112 the air in the lower portions of the lower air distribution channels 116 has greater velocity than the air in the upper portions of the lower air distribution channels 116.

The baffles 122 are oriented at an angle with respect to the direction of travel of air through the air distribution channels 116. In the illustrated embodiment, the baffle angle is approximately 45°. However, in other embodiments the baffle angle may be more or less than 45°. The angled baffles 122 redirect a portion of the air flowing past each opening 114, such that some air is directed through the opening 114 and some passes the opening 114 and continues through the air distribution channel 116. Without the baffles 122, less air would flow through the upstream openings 114 as compared to the downstream openings 114. The baffles 122 even out the distribution of cooling air flowing through the openings 114 so that each module 32 receives a roughly equal amount of cooling air.

Figure 15:
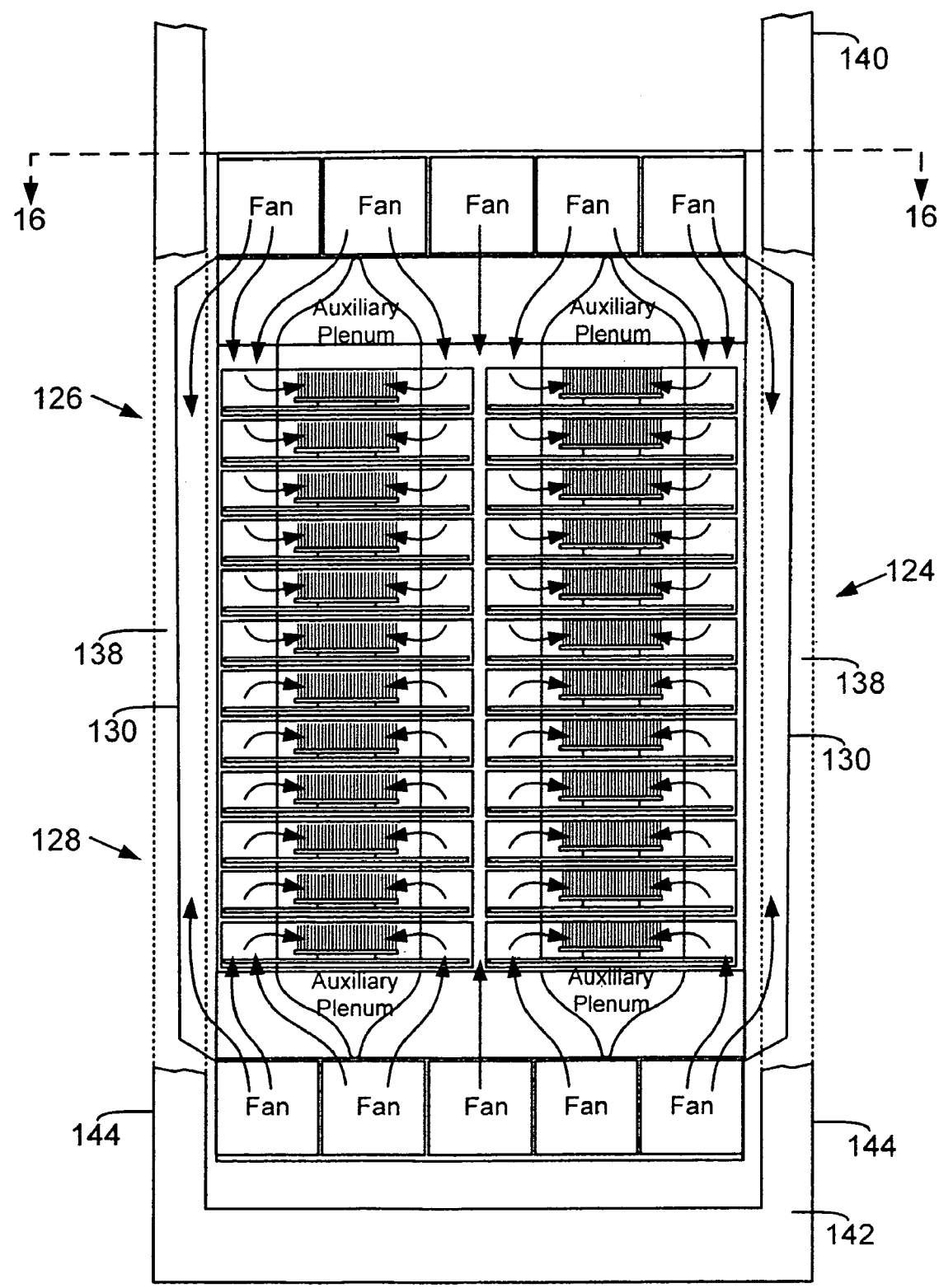
FIG. 15 is a schematic, front elevation view of another embodiment of the present network switch illustrating another method and apparatus for cooling the switch.
Figure 16:
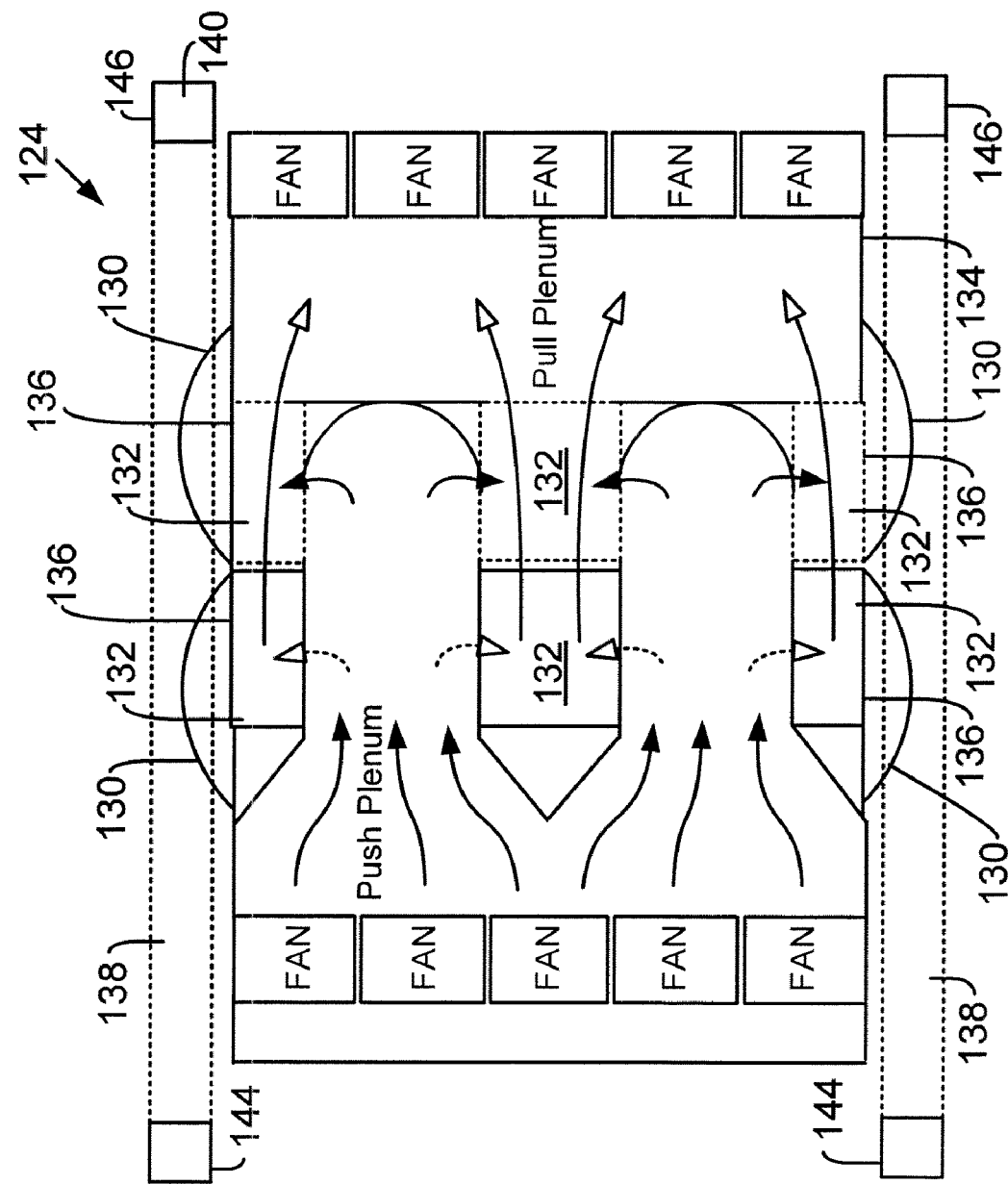
FIG. 16 is a schematic, cross-sectional, top plan view of the switch of FIG. 15, taken through the line 16-16 in FIG. 15.

FIGS. 15 and 16 illustrate an alternative switch 124. FIG. 15 is a front view of the push domains 126, 128, and FIG. 16 is a top cross-sectional view of the switch 124 taken through the line 15-15 in FIG. 15. The switch 124 is similar to the switch 30 of FIG. 2, except that it includes external air ducts 130 that increase the switch's cooling air capacity. With reference to FIG. 15, the external ducts 130 run vertically along the sides of the switch 124. With reference to FIG. 16, the external ducts 130 run adjacent to the air distribution channels 132, but on the outside of the switch chassis 134. The external ducts 130 are in fluid communication with their adjacent air distribution channels 132 through perforations 136 in the switch chassis 134. Air thus flows vertically through both the air distribution channels 132 and the external ducts 130. The external ducts 130 increase the volume available for carrying air vertically through the switch 124, thus increasing the switch's cooling capacity.

With reference to FIGS. 15 and 16, the external ducts 130 reside within a dead space 138 in a mounting rack 140 that supports the switch 124. The rack 140 includes a base 142. A pair of front mounting rails 144 and a pair of rear mounting rails 146 extend vertically from the base 142. As shown in the front view of FIG. 15, the rails 144, 146 provide a small clearance to enable the switch 124 to be slid into the rack 140 from either the front or back side. However, the width of the switch 124 including the external ducts 130 is greater than the side-to-side distance between the rails 144, 146. Thus, in one embodiment the external ducts 130 are secured to the switch chassis 134, but are deformable or collapsible to enable the switch 124 to fit into the rack 140. As the switch 124 slides into the rack 140 and the external ducts 130 squeeze past the rails 144, 146, the ducts 130 collapse against the switch 124. After the ducts 130 clear the rails 144, 146 they expand outward again into the configuration shown in FIGS. 15 and 16. The ducts 130 may be constructed of a flexible and resilient material to enable them to deform and rebound to their original shape. In other embodiments the ducts 130 may be constructed of a flexible but non-resilient material that is supported by resilient members (not shown). The arched shape of the ducts 130 (FIG. 16) facilitates their ability to collapse and rebound to their original shape.

Figure 17:
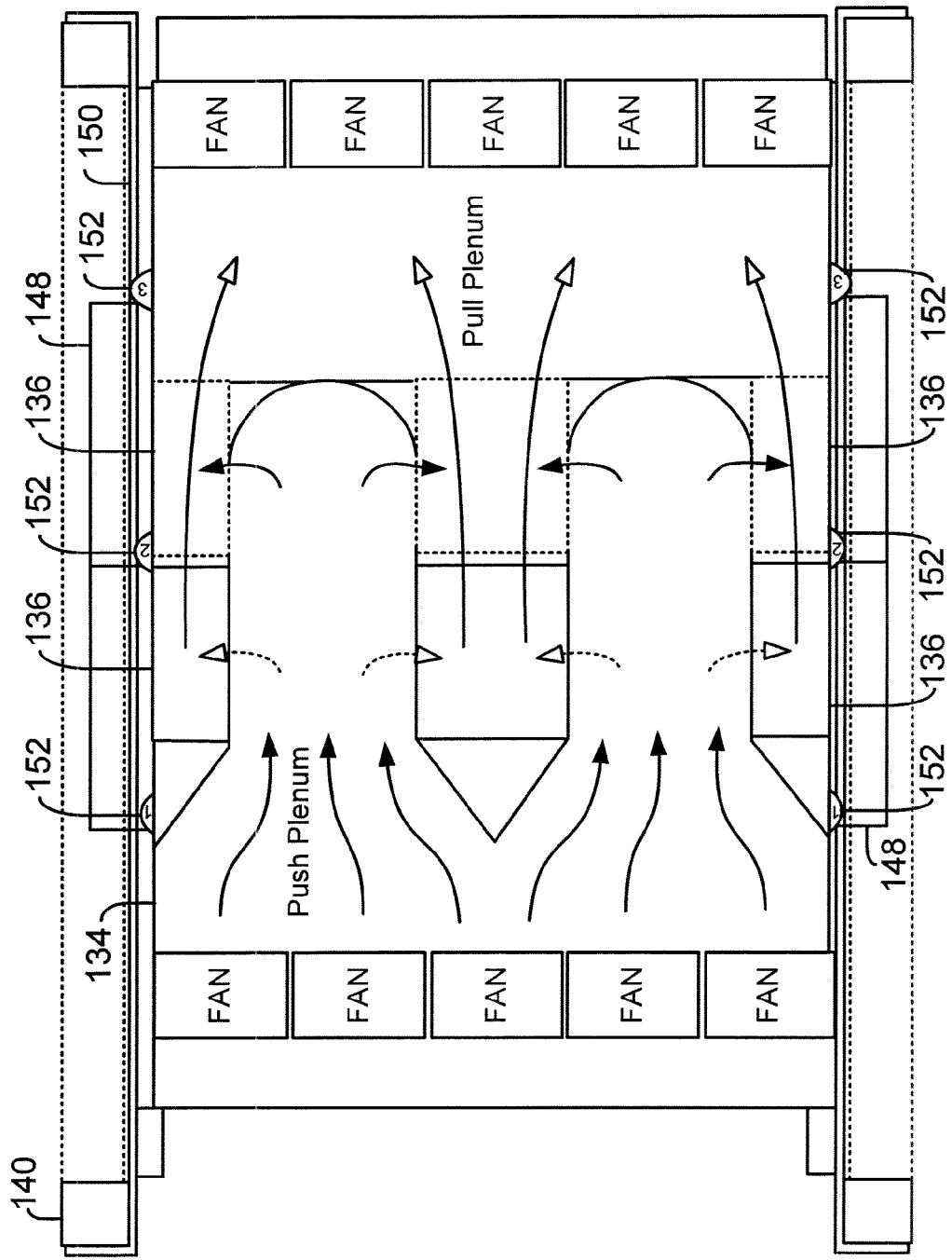
FIG. 17 is a schematic, cross-sectional, top plan view of another embodiment of the present network switch illustrating another method and apparatus for cooling the switch.
Figure 18:
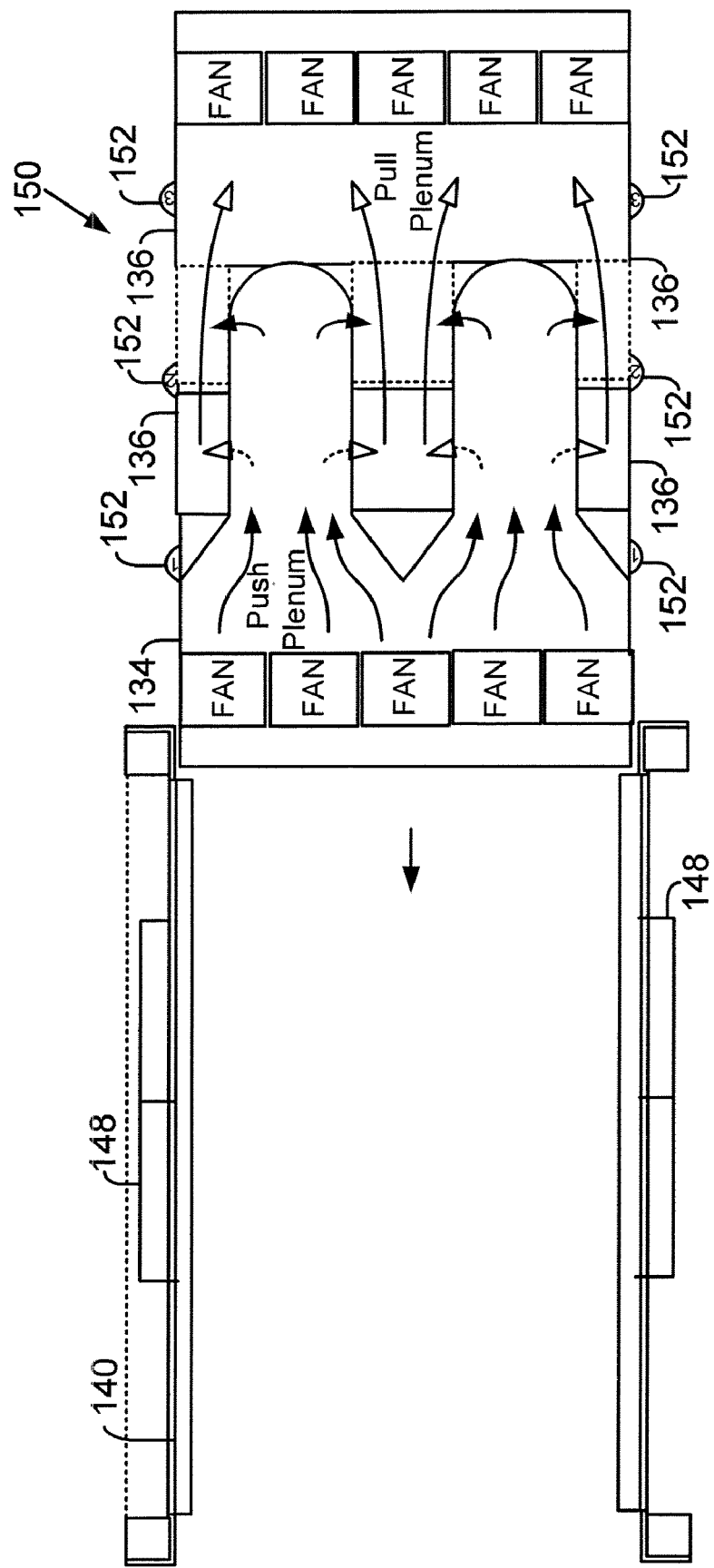
FIG. 18 is a schematic, partially exploded, cross-sectional, top plan view of the switch of FIG. 17.

In still other embodiments the ducts may be constructed of a rigid material. For example, FIGS. 17 and 18 illustrate one example of ducts 148 that are installed within the rack 140 prior to inserting the switch 150. FIG. 17 illustrates the switch 150 in its final position within the rack 140, and FIG. 18 illustrates the switch 150 just before it is slid into the rack 140. Because the ducts 148 are installed in the rack 140 prior to inserting the switch 150, they need not deform during the switch installation process. Instead, the ducts 148 seal around the perforations 136 in the switch chassis 134 as the switch 150 slides into its final position (FIG. 17). As shown in FIGS. 17 and 18, the illustrated switch 150 includes gaskets 152 extending along the outside of the switch chassis 134 around the perforations 136. The gaskets 152 compress and seal against edges of the ducts 148 to prevent leaking of cooling air. In alternative embodiments the gaskets 152 may be secured to the ducts 148, rather than the switch chassis 134. In the illustrated embodiment the ducts 148 have a rectangular cross-section. However, those of ordinary skill in the art will appreciate that the ducts 148 could have alternative shapes.

With reference to FIG. 17, in one embodiment the gaskets 152 may have different heights, and the ducts 148 may extend toward the switch 150 by different amounts. For example, in FIG. 17 a first pair of the gaskets 152, labeled "1," has a first height, a second pair of the gaskets 152, labeled "2," has a second greater height, a third pair of the gaskets 152, labeled "3," has a third even greater height. Similarly, the portions of the ducts 148 that engage the first pair of the gaskets 152 extends farther toward the switch 150 than the portions of the ducts 148 that engage the second and third pairs of the gaskets 152, and the portions of the ducts 148 that engage the second pair of the gaskets 152 extends farther toward the switch 150 than the portions of the ducts 148 that engage the third pair of the gaskets 152. With this configuration, as the switch 150 is slid into the rack 140 the gaskets 152 don't interfere with the ducts 148 until the switch 150 is in its final position within the rack 140.

In the figure descriptions contained herein, terms such as horizontal, vertical, top, bottom, upper, lower, front, back, etc. are used with reference to the illustrated orientation of the apparatus being described. In alternative embodiments, the apparatus may be oriented differently. Accordingly, terms such as horizontal, vertical, top, bottom, upper, lower, front, back, etc. should not be interpreted as limiting.

SCOPE OF THE DISCLOSURE

The above description presents the best mode contemplated for carrying out the present apparatus and methods for cooling network switches, and the manner and process of making and using it, in such full, clear, concise, and exact terms as to enable any person skilled in the art to which it pertains to make and use this apparatus and practice these methods. This apparatus and these methods are, however, susceptible to modifications and alternate constructions from that discussed above that are fully equivalent. Consequently, this apparatus and these methods are not limited to the particular embodiments disclosed. On the contrary, this apparatus and these methods cover all modifications and alternate constructions coming within the spirit and scope of the apparatus and methods as generally expressed by the following claims, which particularly point out and distinctly claim the subject matter of the apparatus and methods.

What is claimed is:

1. A network switch, comprising:
   a plurality of spaced printed circuit boards (PCBs);
   a plurality of fan modules configured to force cooling air through the switch;
   a plurality of plenums configured to carry the forced cooling air, each plenum being associated with at least one of the fan modules;
   wherein the plenums are configured to distribute the cooling air throughout the switch so that no PCB is located upstream from any other PCB, and therefore no PCB preheats the cooling air received by any other PCB; and
   further wherein each plenum includes an elongate portion extending through the switch substantially perpendicularly to the PCBs, the elongate portion including an opening associated with each PCB.

2. The switch of claim 1, wherein the openings vary in size.

3. The switch of claim 2, wherein the openings become increasingly larger with increasing distance from the fan modules.

4. A network switch comprising:
   a plurality of spaced printed circuit boards (PCBs);
   a plurality of fan modules configured to force cooling air through the switch;
   a plurality of plenums configured to carry the forced cooling air, each plenum being associated with at least one of the fan modules;
   wherein the plenums are configured to distribute the cooling air throughout the switch so that no PCB is located upstream from any other PCB, and therefore no PCB preheats the cooling air received by any other PCB; and further wherein each of the plenums is L-shaped in profile and includes a first portion that extends across the switch in a direction parallel to the PCBs, and a second portion that extends through the switch in a direction perpendicular to the PCBs.

5. The switch of claim 4, wherein the switch includes a midplane.

6. The switch of claim 5, wherein for a first subset of the plenums the first portion extends perpendicularly to the midplane to a first side of the midplane and across the midplane, and the second portion extends parallel to the midplane to a second side of the midplane, and for a second subset of the plenums the first portion extends perpendicularly to the midplane to the second side of the midplane and across the midplane, and the second portion extends parallel to the midplane to the first side of the midplane.

7. A network switch, comprising:

a plurality of spaced printed circuit boards (PCBs);

a plurality of fan modules configured to force cooling air through the switch;

a plurality of plenums configured to carry the forced cooling air, each plenum being associated with at least one of the fan modules;

wherein the plenums are configured to distribute the cooling air throughout the switch so that no PCB is located upstream from any other PCB, and therefore no PCB preheats the cooling air received by any other PCB; and further wherein the switch is divided into four independent cooling domains, including an upper push domain, a lower push domain, an upper pull domain, and a lower pull domain.

8. The switch of claim 7, wherein in the push domains cooling air passes first through one of the plenums and then across one of the PCBs, and in the pull domains cooling air passes first across one of the PCBs and then through one of the plenums.

9. A method of cooling a network switch, the switch including a plurality of spaced printed circuit boards (PCBs), each PCB including at least one integrated circuit (IC) device thereon, the method comprising the steps of:

forcing cooling air through the switch such that each of the plurality of spaced PCBs receives cooling air; and distributing the cooling air throughout the switch such that no PCB is located upstream from any other PCB, and therefore no PCB preheats the cooling air received by any other PCB; and further wherein the cooling air travels through a plurality of plenums, each plenum including an elongate portion extending through the switch substantially perpendicularly to the PCBs, the elongate portion including an opening associated with each PCB.

10. The method of claim 9, wherein the cooling air travels through a first portion of each plenum that extends across the switch in a direction parallel to the PCBs, and through a second portion that extends through the switch in a direction perpendicular to the PCBs.

11. A method of cooling a network switch, the switch including a plurality of spaced printed circuit boards (PCBs), each PCB including at least one integrated circuit (IC) device thereon, the method comprising the steps of:

forcing cooling air through the switch such that each of the plurality of spaced PCBs receives cooling air; and distributing the cooling air throughout the switch such that no PCB is located upstream from any other PCB, and therefore no PCB preheats the cooling air received by any other PCB; and further wherein the cooling air is divided into four independent cooling domains, including an upper push domain, a lower push domain, an upper pull domain, and a lower pull domain.

12. A network switch, comprising:

a plurality of spaced printed circuit boards (PCBs);

a plurality of fan modules configured to force cooling air through the switch;

a plurality of plenums configured to carry the forced cooling air, each plenum being associated with at least one of the fan modules;

wherein the plenums are configured to distribute the cooling air throughout the switch so that cooling air entering the switch passes across only one of the PCBs before exiting the switch; and further wherein each plenum includes a portion extending perpendicularly to the PCBs and having a plurality of openings along its length, and each opening is located adjacent one of the PCBs so that cooling air entering any opening will have passed across only one of the PCBs before exiting the switch and cooling air exiting any opening passes across only one of the PCBs before exiting the switch.

13. The switch of claim 12, wherein the switch includes a midplane.

14. A network switch, comprising:

a plurality of spaced printed circuit boards (PCBs);

a plurality of fan modules configured to force cooling air through the switch;

a plurality of plenums configured to carry the forced cooling air, each plenum being associated with at least one of the fan modules;

wherein the plenums are configured to distribute the cooling air throughout the switch so that cooling air entering the switch passes across only one of the PCBs before exiting the switch; and further wherein each of the plenums is L-shaped in profile and includes a first portion that extends across the switch in a direction parallel to the PCBs, and a second portion that extends through the switch in a direction perpendicular to the PCBs.

15. The switch of claim 14, wherein for a first subset of the plenums the first portion extends perpendicularly to the midplane to a first side of the midplane and across the midplane, and the second portion extends parallel to the midplane to a second side of the midplane, and for a second subset of the plenums the first portion extends perpendicularly to the midplane to the second side of the midplane and across the midplane, and the second portion extends parallel to the midplane to the first side of the midplane.

16. A network switch, comprising:

a plurality of spaced printed circuit boards (PCBs);

a plurality of fan modules configured to force cooling air through the switch;

a plurality of plenums configured to carry the forced cooling air, each plenum being associated with at least one of the fan modules;

wherein the plenums are configured to distribute the cooling air throughout the switch so that cooling air entering the switch passes across only one of the PCBs before exiting the switch; and further wherein the switch is divided into four independent cooling domains, including an upper push domain, a lower push domain, an upper pull domain, and a lower pull domain.

17. The switch of claim 16, wherein in the push domains cooling air passes first through one of the plenums and then across one of the PCBs, and in the pull domains cooling air passes first across one of the PCBs and then through one of the plenums.

18. A method of cooling a network switch, the switch including a plurality of spaced printed circuit boards (PCBs), each PCB including at least one integrated circuit (IC) device thereon, the method comprising the steps of:

forcing cooling air through the switch such that each of the plurality of spaced PCBs receives cooling air; and distributing the cooling air throughout the switch such that no PCB is located upstream from any other PCB, and therefore no PCB preheats the cooling air received by any other PCB;

wherein the cooling air travels through a plurality of plenums, each plenum including an elongate portion extending through the switch substantially perpendicularly to the PCBs, the elongate portion including an opening associated with each PCB;

further wherein the cooling air is divided into four independent cooling domains, including an upper push domain, a lower push domain, an upper pull domain, and a lower pull domain; and further wherein in the push domains the cooling air passes first through one of the plenums and then across one of the PCBs, and in the pull domains the cooling air passes first across one of the PCBs and then through one of the plenums.

* * * * *

UNITED STATES PATENT AND TRADEMARK OFFICE
CERTIFICATE OF CORRECTION

PATENT NO.        : 7,646,602 B1
APPLICATION NO.   : 12/201304
DATED             : January 12, 2010
INVENTOR(S)       : Vladimir Tamarkin et al.

It is certified that error appears in the above-identified patent and that said Letters Patent is hereby corrected as shown below:

In column 4, line 25, before "The pull" insert -- The first subset of the module plenums 54, 56, 58, 60 includes an upper pull plenum 56 and a lower pull plenum 60. The second subset of the module plenums 54, 56, 58, 60 includes an upper push plenum 54 and a lower push plenum 58. --.

In column 6, line 47-55, delete "The arrows in FIG. 5 illustrate the pattern of air distribution in the push domains from the rear perspective. Cooling air exits the fan modules 66 and is forced into the air distribution channels 72 through the openings 74 (FIG. 2). After flowing vertically through the air distribution channels 72 the cooling air exits the air distribution channels 72 through the openings 74 (FIG. 2) and flows over the modules 32 at the rear of the switch 30 before exiting the switch 30 at the rear." and insert the same on line 47 (Approx.), after "clarity.", as a continuation of the paragraph.

In column 10, line 59, in claim 4, delete "switch" and insert -- switch, --, therefor.

Signed and Sealed this

Fifth Day of October, 2010

David J. Kappos
*Director of the United States Patent and Trademark Office*